US012666586B2

(12) United States Patent
Chen et al.

(10) Patent No.: US 12,666,586 B2
(45) Date of Patent: Jun. 23, 2026

(54) SEMICONDUCTOR DEVICE WITH GATE-CUT STRUCTURE AND FABRICATION METHODS THEREOF

(71) Applicant: Taiwan Semiconductor Manufacturing Company, Ltd., Hsin-Chu (TW)

(72) Inventors: Yen Yu Chen, Pingtung City (TW); Ming-Yen Tsai, Changhua County (TW); Wen-Hsing Hsieh, Hsinchu City (TW); Ying-Han Chiou, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 359 days.

(21) Appl. No.: 18/365,346

(22) Filed: Aug. 4, 2023

(65) Prior Publication Data
US 2025/0048611 A1 Feb. 6, 2025

(51) Int. Cl.
| | |
|---|---|
| *H10B 10/00* | (2023.01) |
| *H10D 30/01* | (2025.01) |
| *H10D 30/62* | (2025.01) |
| *H10D 30/67* | (2025.01) |
| *H10D 64/01* | (2025.01) |
| *H10D 84/01* | (2025.01) |
| *H10D 84/03* | (2025.01) |

(52) U.S. Cl.
CPC ......... *H10B 10/125* (2023.02); *H10D 30/024* (2025.01); *H10D 30/6211* (2025.01); *H10D 30/6735* (2025.01); *H10D 64/017* (2025.01);
*H10D 84/0188* (2025.01); *H10D 84/0193* (2025.01); *H10D 84/038* (2025.01)

(58) Field of Classification Search
CPC .............................. H10B 10/12; H10D 84/853
See application file for complete search history.

(56) References Cited

U.S. PATENT DOCUMENTS

| | | |
|---|---|---|
| 2020/0006354 A1 | 1/2020 | Wen et al. |
| 2020/0052090 A1 | 2/2020 | Hsiao et al. |
| 2020/0091008 A1 | 3/2020 | Wen et al. |
| 2020/0176259 A1 | 6/2020 | Lee et al. |
| 2020/0176320 A1 | 6/2020 | Chen et al. |
| 2021/0118875 A1 | 4/2021 | Wu et al. |

(Continued)

FOREIGN PATENT DOCUMENTS

| | | |
|---|---|---|
| TW | 202137571 A | 10/2021 |
| TW | 202143443 A | 11/2021 |

(Continued)

*Primary Examiner* — Fernando L Toledo
*Assistant Examiner* — Adam S Bowen
(74) *Attorney, Agent, or Firm* — HAYNES AND BOONE, LLP

(57) ABSTRACT

A method of forming a semiconductor structure includes forming a fin over a semiconductor substrate, forming an isolation region on sidewalls of the fin, forming a metal gate over the fin and the isolation region, etching the metal gate to form a trench through the isolation region, passivating the top portion of the semiconductor substrate exposed in the trench to form a dielectric layer at a bottom of the trench, and depositing a dielectric material in the trench to form a dielectric structure. The dielectric structure divides the metal gate into two sections.

20 Claims, 20 Drawing Sheets

(56) References Cited

U.S. PATENT DOCUMENTS

| 2021/0249313 | A1* | 8/2021 | Chen | ......... H10D 84/0188 |
|---|---|---|---|---|
| 2021/0367033 | A1 | 11/2021 | Wang et al. | |
| 2022/0285274 | A1 | 9/2022 | Ren | |
| 2022/0285369 | A1 | 9/2022 | Lin et al. | |
| 2022/0344216 | A1 | 10/2022 | Min et al. | |
| 2022/0359225 | A1 | 11/2022 | More et al. | |
| 2022/0367456 | A1 | 11/2022 | Chen et al. | |
| 2022/0384616 | A1 | 12/2022 | Jang et al. | |
| 2023/0232605 | A1 | 7/2023 | Ghani | |

FOREIGN PATENT DOCUMENTS

| TW | 202234589 A | 9/2022 |
|---|---|---|
| TW | 202236567 A | 9/2022 |

* cited by examiner

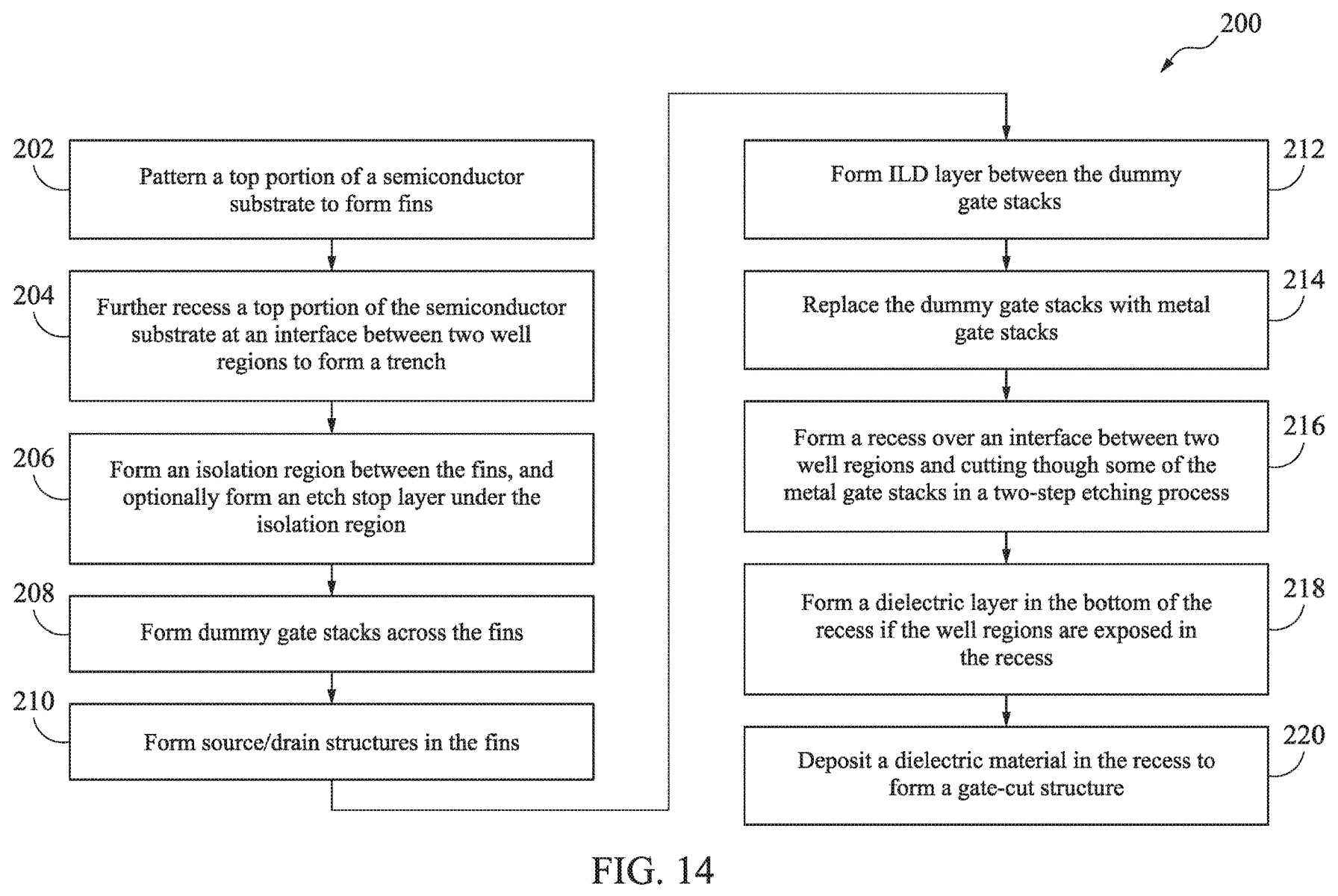

200

212   Form ILD layer between the dummy gate stacks

214   Replace the dummy gate stacks with metal gate stacks

216   Form a recess over an interface between two well regions and cutting though some of the metal gate stacks in a two-step etching process 218   Form a dielectric layer in the bottom of the recess if the well regions are exposed in the recess 220   Deposit a dielectric material in the recess to form a gate-cut structure 202   Pattern a top portion of a semiconductor substrate to form fins 204   Further recess a top portion of the semiconductor substrate at an interface between two well regions to form a trench 206   Form an isolation region between the fins, and optionally form an etch stop layer under the isolation region 208   Form dummy gate stacks across the fins 210   Form source/drain structures in the fins

FIG. 14

SEMICONDUCTOR DEVICE WITH GATE-CUT STRUCTURE AND FABRICATION METHODS THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. As the semiconductor industry has progressed into nanometer technology process nodes in pursuit of higher device density, higher performance, and lower costs, challenges from both fabrication and design issues have resulted in the development of multi-gate semiconductor devices including fin field effect transistor (FinFET) and Gate-All-Around (GAA) devices.

Although advantages of the FinFET and GAA devices include reducing short channel effects and increasing current flow, the associated fabrication processes continue to become more challenging as the feature sizes and spacing continue to decrease. Therefore, while the current methods have been satisfactory in many respects, as transistor dimensions are aggressively scaled down, further improvements of the multi-gate semiconductor devices are still needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 14 shows a flow chart of a method for forming a semiconductor structure, in accordance with some embodiments of the present disclosure.

DETAILED DESCRIPTION

Figure 1:
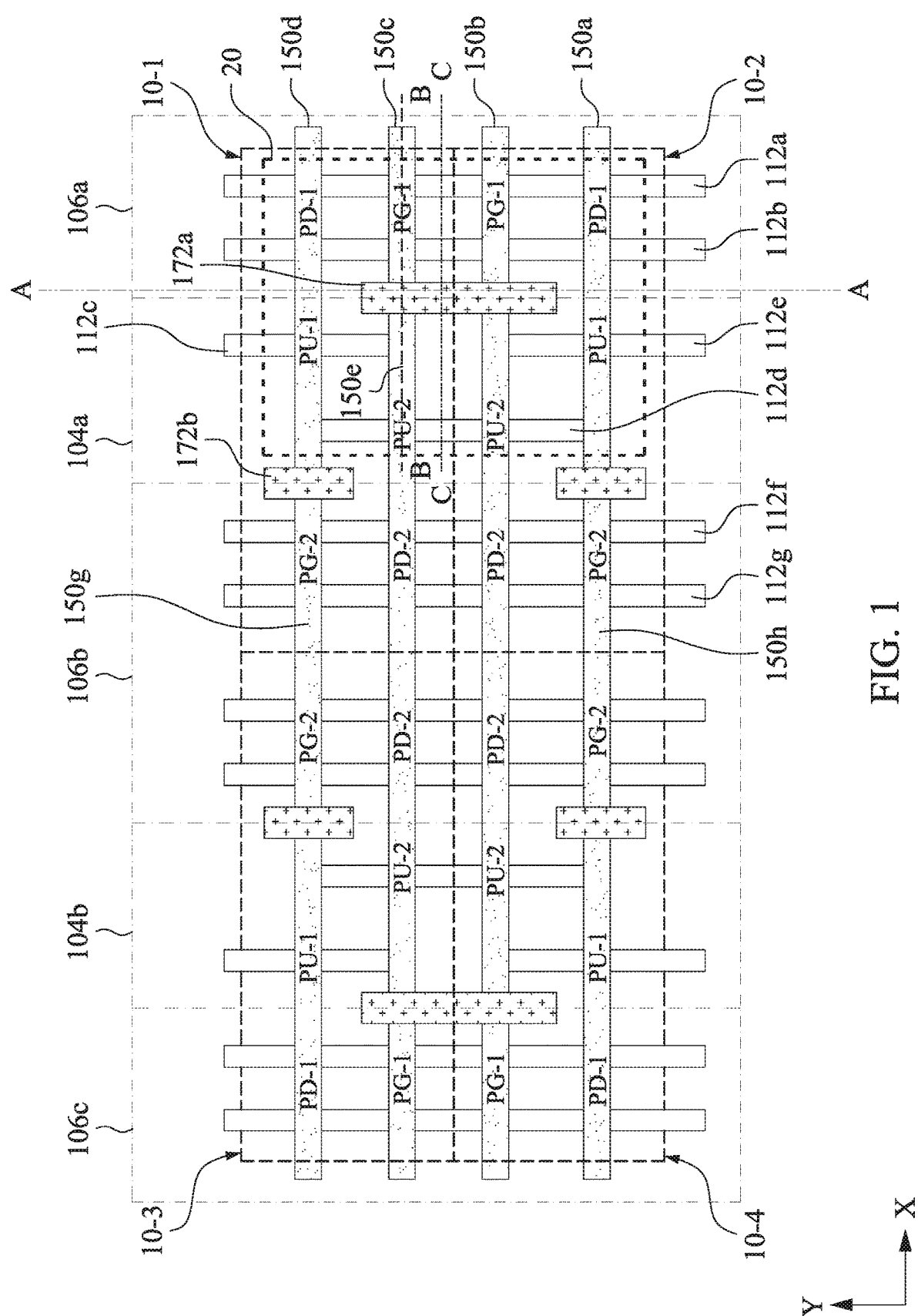
FIG. 1 shows a layout illustrating a semiconductor structure of SRAM cells, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with isolation structures "cutting" metal gate stacks of the multi-gate devices into shorter sections (segments). Such isolation structures may also be referred to as cut-metal-gate (CMG) structures or gate-cut structures. Metal gate stacks in multi-gate devices can be formed as long gate structures extending across multiple active regions (e.g., fin regions) of multiple field effect transistors (FETs). Once the gate structures are formed, a patterning process can "cut" one or more of the long gate structures into shorter sections. In other words, the patterning process can remove redundant gate portions of the one or more long gate structures to form one or more isolation trenches (also referred to as "CMG trenches") between the FETs and separate the long gate structures into shorter sections. This process is referred to as a CMG process. Subsequently, the isolation trenches formed between the separated sections of the long gate structures can be filled with a dielectric material to form isolation structures. The isolation structures electrically isolate the separated gate structure sections of adjacent multi-gate devices.

Fin field effect transistors (FinFETs) and multi-bridge-channel (MBC) transistors are examples of multi-gate devices that have become popular and promising candidates for high performance and low leakage applications. A Fin-FET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. Presented herein are specific embodiments of FinFETs as an exemplary type of multi-gate transistors. One of ordinary skill may recognize other examples of semiconductor devices, such as GAA transistors, that may as well benefit from aspects of the present disclosure. Further, gate-cut structures find wide applications in various circuit implementations. Presented herein are specific embodiments of a static random access memory (SRAM) circuit as an exemplary circuit that implements gate-cut structures. One or ordinary skill may recognize other examples of circuits, such as logic circuits, input/output (I/O) circuits, etc., that may as well benefit from aspects of the present disclosure.

FIG. 1 illustrates a layout of an SRAM circuit that includes SRAM cells 10_1, 10_2, 10_3, and 10_4 (collectively as SRAM cells 10), in accordance with some embodiments of the disclosure. The SRAM circuit shown in FIG. 1 may be a portion of a larger SRAM cell array. In some embodiments, the transistors within the SRAM cells 10 are FinFETs in the N-type well regions 104a and 104b and the P-type well regions 106a through 106c. The N-type well region 104b is positioned between the P-type well regions 106b and 106c, and the N-type well region 104a is positioned between the P-type well regions 106a and 106b.

The two adjacent SRAM cells 10_1 and 10_3 are arranged in the same row of the SRAM cell array. The two adjacent SRAM cells 10_1 and 10_2 are arranged in the same column of the SRAM cell array. The two adjacent SRAM cells 10_3 and 10_4 are arranged in the same column of the SRAM cell array. In other words, the two adjacent SRAM cells 10_2 and 10_4 are arranged in the same row of the SRAM cell array. In FIG. 1, each of the SRAM cells 10 has the same rectangular shape/region with a width and a height, and the height is less than the width. It should be noted that the SRAM circuit shown in FIG. 1 is merely an example and is not intended to limit the SRAM cells 10 of the SRAM cell array.

In the SRAM cell array, the fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins.

In the SRAM cell 10_1, the pass-gate transistor PG-1 is formed at the cross point of the fins 112a and 112b and the gate structure 150c on the P-type well region 106a. The pull-down transistor PD-1 is formed at the cross point of the fins 112a and 112b and the gate structure 150d on the P-type well region 106a. The pass-gate transistor PG-2 is formed at the cross point of the fins 112g and 112f and the gate structure 150g on the P-type well region 106b. The pull-down transistor PD-2 is formed at the cross point of the fin 112g and 112f and the gate structure 150e on the P-type well region 106b. The pull-up transistor PU-1 is formed at the cross point of the fin 112c and the gate structure 150d on the N-type well region 104a. The pull-up transistor PU-2 is formed at the cross point of the fin 112d and the gate structure 150e on the N-type well region 104a. In such embodiments, the pull-down transistors PD-1 and PD-2 and the pass-gate transistors PG-1 and PG-2 are the dual-fin transistors, and the pull-up transistors PU-1 and PU-2 are the single-fin transistors.

Various contacts and their corresponding interconnect vias may be employed to couple components in each SRAM cells 10_1 through 10_4. Through a via and a gate contact, a word line (WL) contact (not shown) may be coupled to the gate of pass-gate transistor PG-1 through the gate structure 150c, and another word line contact WL is coupled to the gate of pass-gate transistor PG-2 through the gate structure 150g. Likewise, a bit line (BL) contact (not shown) is coupled to the drain of pass-gate transistor PG-1, and a complementary bit line contact BLB is coupled to the drain of pass-gate transistor PG-2.

A power source contact (not shown) coupled to the power supply node VDD is coupled to the source of the pull-up transistor PU-1, and another power source contact (not shown) coupled to the power supply node VDD is coupled to the source of the pull-up transistor PU-2. A ground contact (not shown) coupled to the ground VSS is coupled to the source of the pull-down transistor PD-1, and another ground contact (not shown) coupled to the ground VSS is coupled to the source of the pull-down transistor PD-2.

In such embodiments, the SRAM cell 10_2 is a duplicate cell for the SRAM cell 10_1 but flipped over the X axis. Furthermore, the SRAM cell 10_3 is a duplicate cell for the SRAM cell 10_1 but flipped over the Y axis. Moreover, the SRAM cell 10_4 is a duplicate cell for the SRAM cell 10_3 but flipped over the X axis. The common contacts (e.g., BL. VDD, and VSS), are combined to save space.

The gate structure 150d is shared by the pull-up transistor PU-1 and the pull-down transistor PD-1 of the SRAM cell 10_1, and the gate structure 150g is shared by the pass-gate transistors PG-2 of the SRAM cells 10_1 and 10_3. A dielectric structure 172b is formed over a boundary (or a junction, interface) between the P-type well region 106b and the N-type well region 104a, and the gate structures 150d and 150g are separated by the dielectric structure 172b. That is, the dielectric structure 172b is a gate-cut structure (or referred to as CMG structure or CMG feature) for the gate structures 150d and 150g. The gate structure 150e is shared by the pull-up transistor PU-2 and the pull-down PD-2 of the SRAM cell 10_1. A dielectric structure 172a is formed over a boundary (or a junction, interface) between the P-type well region 106a and the N-type well region 104a, and the gate structures 150c and 150e are separated by the dielectric structure 172a. That is, the dielectric structure 172a is a gate-cut structure for the gate structures 150c and 150e. In some embodiments, the gate-cut structures are formed by a CMG process.

Figure 2B:
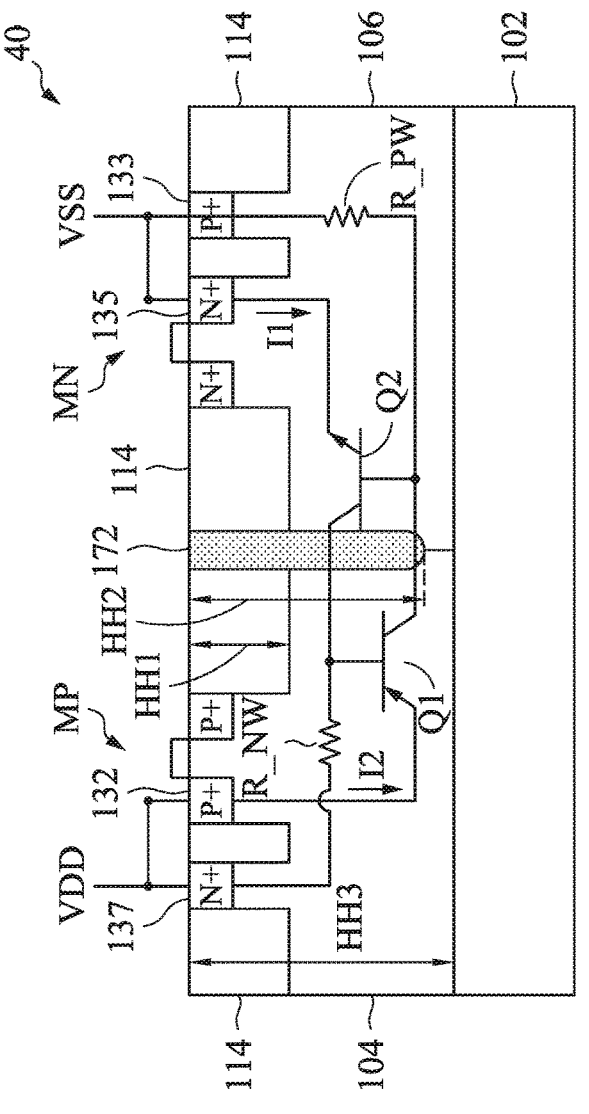
FIG. 2B illustrates a cross-sectional view illustrating the SCR of FIG. 3A, in accordance with some embodiments of the disclosure.
Figure 2A:
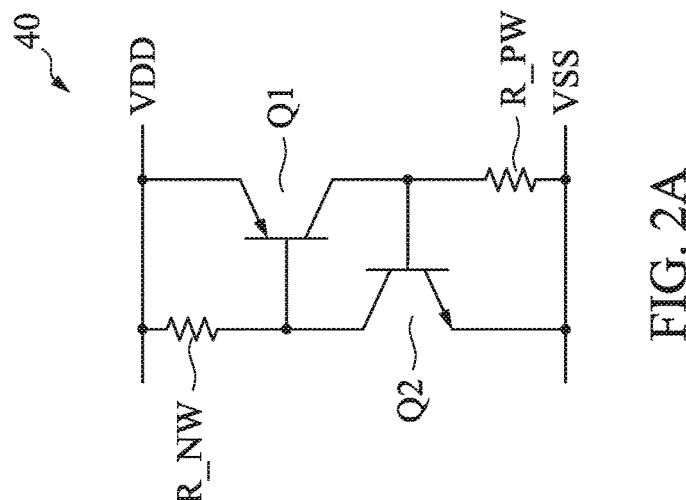
FIG. 2A illustrates an equivalent circuit of a semiconductor-controlled rectifier (SCR) in each SRAM cell of FIG. 1.

FIG. 2A illustrates an equivalent circuit of a semiconductor-controlled rectifier (SCR) 40 in each SRAM cell 10 of FIG. 1, and FIG. 2B illustrates a cross-sectional view illustrating the SCR 40 of FIG. 2A, in accordance with some embodiments of the disclosure.

Referring to FIGS. 2A and 2B together, the P-type well region 106 and the N-type well region 104 are formed on a substrate 102. In some embodiments, the substrate 102 is a P-type substrate, e.g., Si substrate. A PMOS transistor MP of the SRAM cell 10 is formed on the N-type well region 104, and an NMOS transistor MN of the SRAM cell 10 is formed on the P-type well region 106. Furthermore, the N-type well pick-up region 137 forms bulk terminal of the PMOS transistor MP, and the P-type well pick-up region 133 forms bulk terminal of the NMOS transistor MN.

The PMOS transistor MP and the NMOS transistor MN are illustrated as planar transistors in FIGS. 2A and 2B for simplicity purpose. As discussed above, the PMOS transistor MP and the NMOS transistor MN can be multi-gate transistors, such as FinFETs or GAA transistors. Furthermore, the PMOS transistor MP may be the pull-up transistor PU-1 or PU-2 of the SRAM cell 10 in FIG. 1, and the NMOS transistor MN may be the pass-gate transistor PG-1 or PG-2 or the pull-down transistor PD-1 or PD-2 of the SRAM cell 10 in FIG. 1.

A parasitic PNP transistor Q1 is shown with an emitter formed by the P+ region 132 (i.e., source of the PMOS transistor MP), a base formed by the N-type well region 104, and a collector formed by the P-type well region 106 and/or the substrate 102. The base of the PNP transistor Q1 is coupled to the N-type well pick-up region 137 through the resistor R_NW. The N-type well pick-up region 137 is an electrical connection made by an N-type region on the N-type well region 104, and the N-type well pick-up region 137 is configured to connect to a power supply node VDD. The resistor R_NW is a parasitic component (intrinsic resistance) of the N-type well region 104. The collector of the PNP transistor Q1 is coupled to the P-type well pick-up region 133 through a resistor R_PW. The P-type well pick-up region 133 is an electrical connection made by a P-type region on the P-type well region 106, and the P-type well pick-up region 133 is configured to connect to a ground VSS. The resistor R_PW is a parasitic component (intrinsic resistance) of the P-type well region 106. In some embodiments, the collector of the PNP transistor Q1 is coupled to the P-type well pick-up region 133 through the resistor R_PW and a parasitic resistor (not shown) of the substrate 102.

A parasitic NPN transistor Q2 is shown with an emitter formed by the N+ region 135 (i.e., source of the NMOS transistor MN), a base formed by the P-type well region 106 and/or the substrate 102, and a collector formed by the N-type well region 104.

If the PNP transistor Q1 or the NPN transistor Q2 is turned on when one of the PN junctions in the transistor Q1/Q2 is forward-biased, this may cause unwanted latch-up in the SRAM cell 10 and, in some cases, even permanently damage the SRAM cell 10.

In FIG. 2B, the NMOS transistor MN and the PMOS transistor MP is separated by an isolation region 114 (or an isolation structure 114, or an isolation layer 114), such as a shallow trench isolation (STI). Furthermore, the gate-cut structure 172 (e.g., 172a and/or 172b in FIG. 1) is formed and may extend from the isolation region 114 to the P-type well region 106 and the N-type well region 104. That is, the gate-cut structure 172 may penetrate the isolation region 114. In some embodiments, the depth $HH_1$ of the isolation region 114 is less than the depth $HH_2$ of the gate-cut structure 172, and the depth $HH_2$ of the gate-cut structure 172 is less than the depth $HH_3$ of the P-type well region 106 and the N-type well region 104, i.e., $HH_1 < HH_2 < HH_3$. Furthermore, material of the gate-cut structure 172 is different from the isolation region 114.

In some embodiments, the gate-cut structure 172 forms a barrier between the collector of the parasitic NPN transistor Q2 and the base of the parasitic NPN transistor Q1 and between the collector of the parasitic PNP transistor Q1 and the base of the parasitic NPN transistor Q2. The selection of the refill material(s) of the gate-cut structure 172 may be important, as the refill material(s) has an impact on strengths of a first leakage current $I_1$ from the N+ region 135 to the N-type well region 104 and/or a second leakage current $I_2$ from the P+ region 132 to the P-type well region 106.

In some embodiments, the gate-cut structure 172 includes a refill material having positive charges, such as SiN, SiOCN or SiON. The refill material having positive charges can induce negative charges in the N-type well region 104. The induced negative charges in the N-type well region 104 can increase the first leakage current $I_1$ from the N+ region 135 to the N-type well region 104 due to the increased carrier charge density in both N-type well region 104 and the P-type well region 106. The increased carrier charge density is associated with increased leakage between the N+ region 135 and the N-type well region 104. Thus, a trigger voltage of the SCR may be decreased due to the increased first leakage current $I_1$. If the parasitic PNP transistor Q1 is turned on by the first leakage current $I_1$, latch up of the SRAM cell 10 may be triggered. As to be discussed in further detail below, embodiments of the present disclosure provide gate-cut structures 172 that tend to reduce the carrier charge density both in the N-type well region 104 and the P-type well region 106 and thus suppress the leakage current and improve latch-up performance.

Figure 3A:
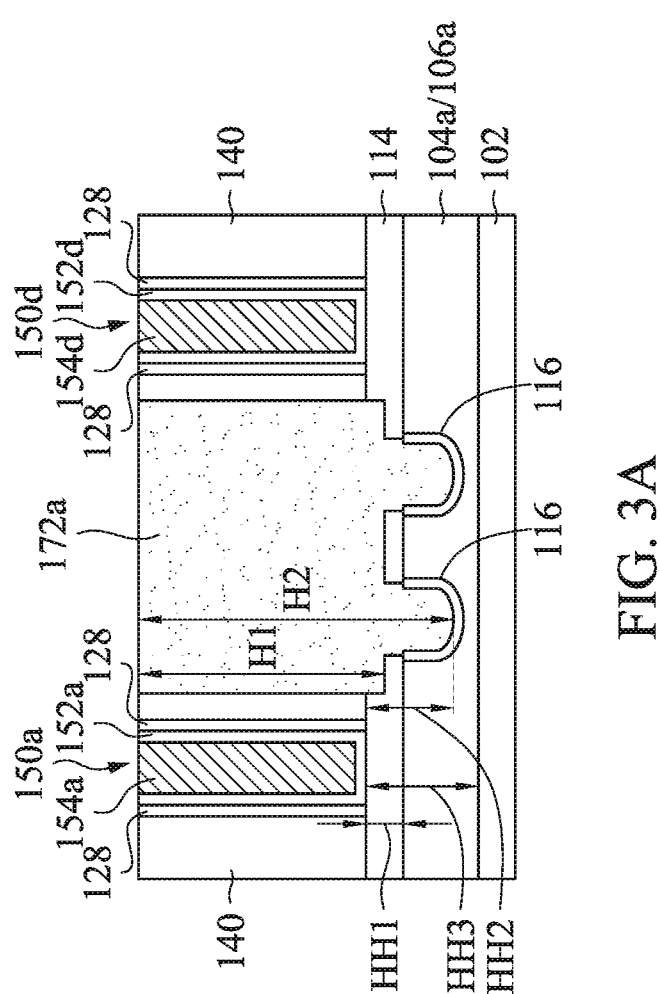
FIGS. 3A, 3B, and 3C illustrate cross-sectional views of the semiconductor structure of FIG. 1, in accordance with some embodiments of the disclosure.
Figure 3C:
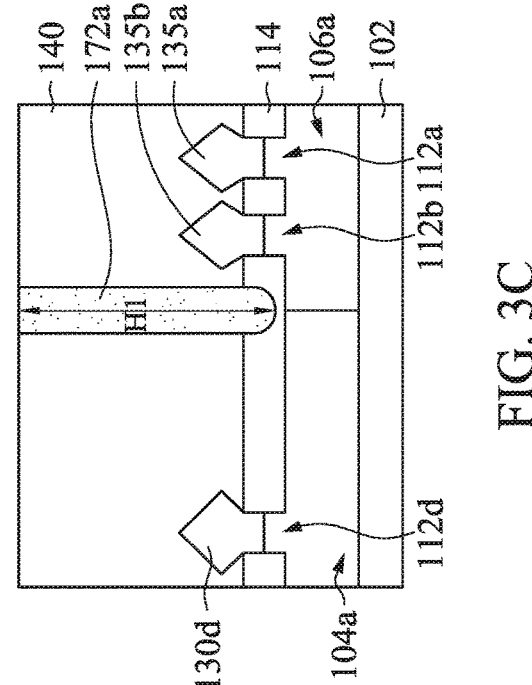
Figure 3B:
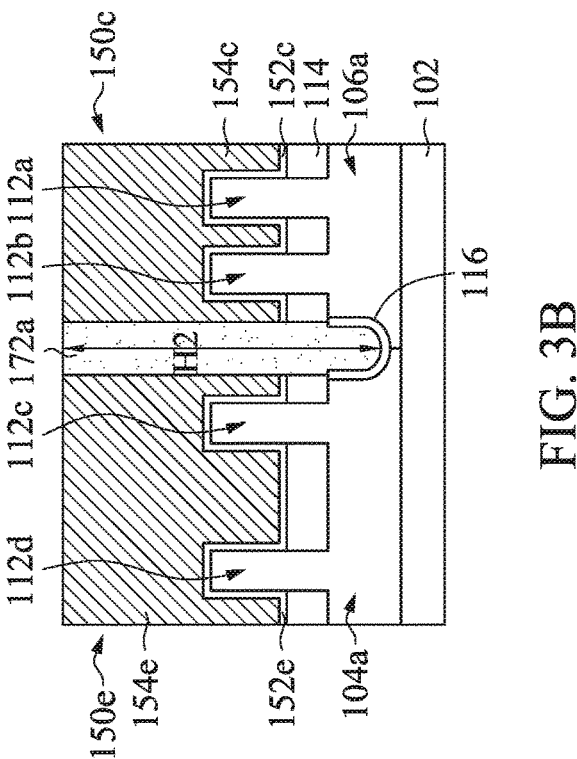

FIGS. 3A, 3B, 3C illustrate cross-sectional views of the SRAM structure of the SRAM cells 10_1 and 10_2 along section lines A-A, B-B, C-C of FIG. 1, respectively, in accordance with some embodiments of the disclosure. Referring to FIG. 3A, the P-type well region 106a and the N-type well region 104a are formed on a substrate 102. In some embodiments, the substrate 102 is a silicon (Si) substrate. An isolation region 114 is formed over the P-type well region 106a and the N-type well region 104a. In some embodiments, the isolation region 114 is shallow trench isolation (STI) region.

Inter-layer dielectric (ILD) layer 140 is formed over the isolation region 114. In some embodiments, the interlayer dielectric layer 140 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The gate structures 150a and 150d are formed over the isolation region 114, and the gate structures 150a and 150d are surrounded by the interlayer dielectric layer 140. The gate structure 150a includes a gate electrode layer 154a and a gate dielectric layer 152a, and the gate structure 150d includes a gate electrode layer 154d and a gate dielectric layer 152d. In some embodiments, the gate electrode layers 154a and 154d are made of a conductive material, such as aluminum (Al), copper (Cu), tungsten (W), titanium (Ti), tantalum (Ta), or another applicable material. Gate spacers 128 are formed on the sidewalls of the gate structures 150a and 150d.

The gate-cut structure 172a may have different heights at different areas of the semiconductor device, such as the heights H1 and H2. For clarity, the heights HH1, HH2, and HH3 in FIG. 2B that are referenced to the top surface of the isolation region 114 are also depicted in FIG. 3A. In some embodiments, center portions of the gate-cut structure 172a that replace redundant portions of the gate structures 150b and 150c extend through the isolation region 114 and extend into a top portion of the substrate (i.e., into the N-type well region 104a and/or the P-type well region 106a). As a comparison, other portions of the gate-cut structure 172a extend into the isolation region 114 but does not extend into a top portion of the substrate (i.e., above the N-type well region 104a and/or the P-type well region 106a). The different heights H1 and H2 of respective portions of the gate-cut structure 172a are a result of the etching process used in the formation of the gate-cut structure 172a. In some embodiments, the isolation region 114 and the gate-cut structure 172a are made of different materials.

Referring to FIG. 3B, the P-type well region 106a and the N-type well region 104a are formed on the substrate 102. The P-type well region 106a and the N-type well region 104a may also be considered as a top portion of the substrate 102. The fins 112a and 112b are formed on the P-type well region 106a, and the fins 112c and 112d are formed on the N-type well region 104a. The isolation region 114 is formed over the P-type well region 106a and the N-type well region 104a. The fins 112a through 112d are separated by the isolation region 114.

The gate dielectric layer 152e is formed over the isolation region 114 and the fins 112c and 112d. The gate electrode layer 154e is formed over the gate dielectric layers 152e and is positioned over a top surface of the fins 112c and 112d. The gate electrode layer 154e and the gate dielectric layer 152e over the fin 112d form a gate structure for the pull-up transistor PU-2. Furthermore, the gate dielectric layer 152c is formed over the isolation region 114 and the fins 112a and 112b. The gate electrode layer 154c is formed over the gate dielectric layers 152c and is positioned over a top surface of the fins 112b and 112a. The gate electrode layer 154c and the gate dielectric layer 152c over the fins 112a and 112b form a gate structure for the pass-gate transistor PG-1. In FIG. 3B, the gate dielectric layers 152e and 152c are separated by the gate-cut structure 172a, and the gate electrode layers 154e and 154c are separated by the gate-cut structure 172a.

Referring to FIG. 3C, the P-type well region 106a and the N-type well region 104a are formed on the substrate 102. The fins 112a and 112b are formed on the P-type well region 106a, and the fin 112d is formed on the N-type well region 104a. The isolation region 114 is formed over the P-type well region 106a and the N-type well region 104a. The fins 112a, 112b, and 112d are separated by the isolation region 114.

The source/drain structure 130d forms the source/drain region on the fin 112d. In some embodiments, the source/ drain structure 130d is a P-type epitaxy structure. The source/drain structure 135b form the source/drain region on the fin 112b, and the source/drain structure 135a form the source/drain region on the fin 112a. In some embodiments, the source/drain structures 135a and 135b are N-type epitaxial structures. The interlayer dielectric layer 140 is formed over the isolation region 114, the source/drain structure 130d and the source/drain structures 135a and 135b.

In some embodiments, the material of the source/drain structure 130d includes epitaxy material. The epitaxy material is selected from a group consisting of SiGe content, SiGeC content, Ge-content, or a combination thereof. In some embodiments, the material of the source/drain structures 135a and 135b includes epitaxy material. The epitaxy material is selected from a group consisting of SiP content, SiC content, SiPC, SiAs, Si, or a combination thereof.

As shown in FIGS. 3A and 3B, the bottom portions of the gate-cut structure 172a extending below the isolation region 114 are separated from the semiconductor material of the top portion of the substrate (i.e., the N-type well region 104a and/or the P-type well region 106a) by a dielectric layer 116. The dielectric layer 116 creates a buffer zone at the interface between the positive charges from the gate-cut structure 172a and the semiconductor material of the N-type well region 104a and/or the P-type well region 106a. The buffer zone reduces the attraction force towards the carrier charges in the well regions and suppresses the substrate leakage current. In some embodiments, the dielectric layer 116 is an oxide layer, such as silicon dioxide, formed by passivating surfaces of the N-type well region 104a and/or the P-type well region 106a exposed in the CMG trench. The passivating process may be an oxidization process, such as an $O_2$ plasma process, thermal oxidation process, in-situ steam generation oxidation process (ISSG), or other oxidation process. The materials of the dielectric layer 116, the gate-cut structure 172a, and the isolation region 114 may be different from each other. Optionally, the dielectric layer 116 and a region of a thin layer under the dielectric layer 116 may be doped with positive charges, such as boron, to neutralize the negative carrier charges in proximity to the gate-cut structure 172a. That is, a depletion region is created at the interface between the dielectric layer 116 and the semiconductor material of the well regions. The boron concentration decreases when the distance to the dielectric layer 116 increases. The depletion region further limits the movement of the negative carrier charges in the well regions in proximity to the gate-cut structure 172a.

As shown in FIG. 3C, as a comparison, since the gate-cut structure 172a in the source/drain regions does not extend through the isolation region 114, the bottom portion of the gate-cut structure 172a in the source/drain regions is not covered by the dielectric layer 116. That is, there is no dielectric layer 116 formed at the interface between the gate-cut structure 172a and the isolation region 114 in the source/drain region.

FIGS. 4-7 and 9 illustrate perspective views of various stages of manufacturing a semiconductor structure shown in block 20 in FIG. 1 in accordance with some embodiments. FIGS. 8A-8C illustrate cross-sectional view along section line A-A of the semiconductor structure shown in FIG. 7 during various steps of forming a CMG trench in accordance with some embodiments.

Figure 4:
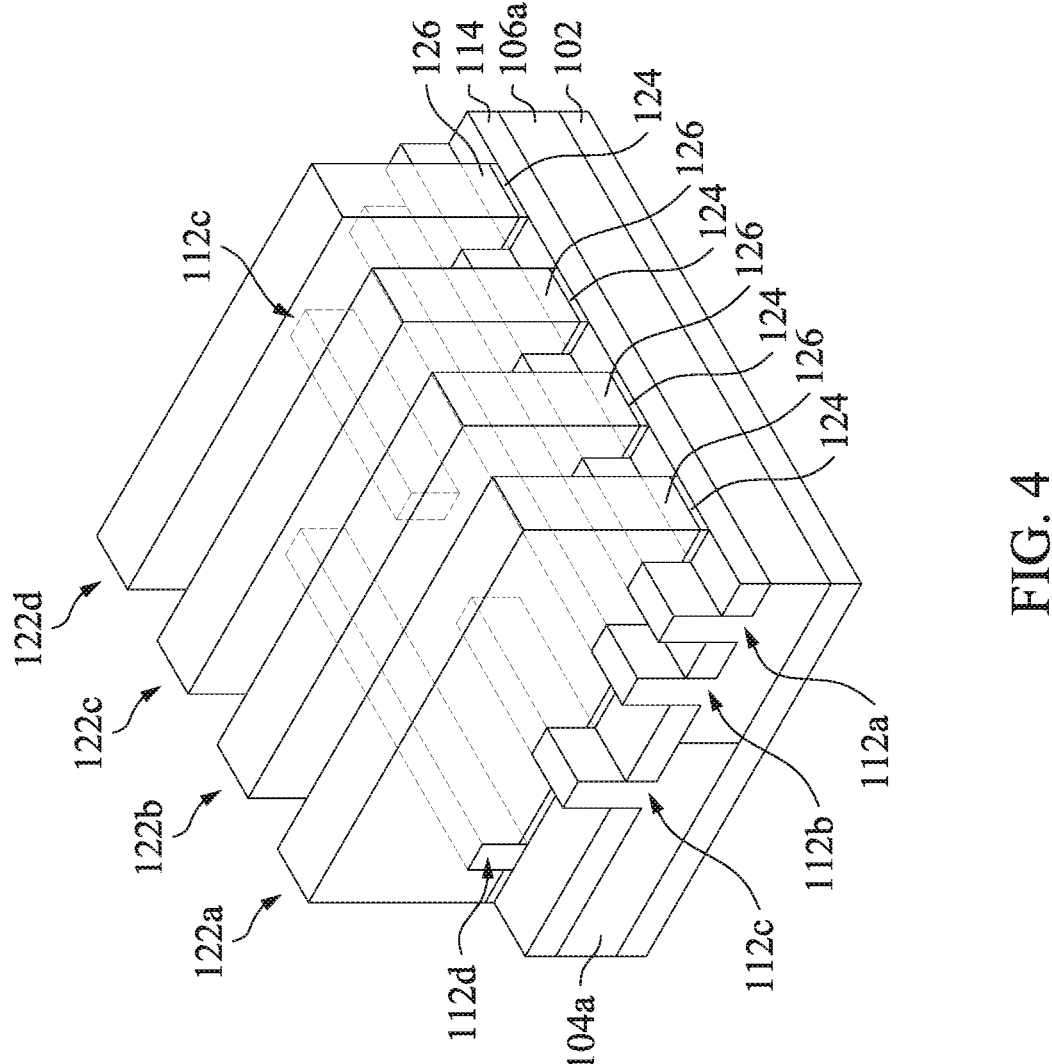
FIGS. 4, 5, 6, 7, and 9 illustrate perspective views of a semiconductor structure during a fabrication process according to the method of FIG. 14, in accordance with some embodiments of the present disclosure.

As show in FIG. 4, a substrate 102 includes a first-type well region 104a and a second-type well region 106a. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

The first-type well region 104a and the second-type well region 106a may be formed by doping different types of dopants in the substrate 102. In some embodiments, the first-type well region 104a is an N-type well region doped with N-type dopants, and the second-type well region 106a is a P-type well region doped with P-type dopants. In some embodiments, the first-type well region 104a includes Si, SiGe, SiGeB, Ge, InSb, GaSb, InGaSb, or the like, and the second-type well region 106a includes Si, SiP, SiC, SiPC, InP, GaAs, AlAs, InAs, InAlAs, InGaAs, or the like.

After the first-type well region 104a and the second-type well region 106a are formed, fins 112a to 112e are formed over the substrate. More specifically, the fins 112a and 112b are formed over the second-type well region 106a, and the fins 112c. 112d, and 112e are formed over the first-type well region 104a in accordance with some embodiments. The fins 112a to 112e may be formed by patterning a top portion of the substrate 102. For example, the fins 112a and 112b may be formed by patterning the second-type well region 106a, and the fins 112c, 112d, and 112e may be formed by patterning the first-type well region 104a. In addition, the fins 112c and 112e are aligned with but separated from each other. The fins 112c and 112e may be formed by a fin cut process that recesses a middle portion of an otherwise continuous fin and divides it into a first section corresponding to the fin 112c and a second section corresponding to the fin 112e. The fin cut process may also remove the two end portions of the fin 112d, such that the end portions of the fin 112d do not extend beyond outside gate sidewalls of the dummy gate stack 122a and 122d.

After the fins 112a to 112e are formed, an isolation structure 114 is formed over the substrate 102, and the fins 112a through 112e are surrounded by the isolation structure 114. The isolation structure 114 may be formed by depositing an insulating layer over the substrate 102 and recessing the insulating layer. In some embodiments, the isolation structure 114 is made of silicon oxide, silicon nitride, silicon oxynitride, fluoride-doped silicate glass (FSG), or other low-K dielectric materials.

Next, dummy gate stacks 122a through 122d are formed across the fins 112a to 112e and extend onto the isolation structure 114. More specifically, the dummy gate stacks 122a and 122b are formed across the fins 112a and 112b over the second-type well region 106a and across the fins 112d and 122e over the first-type well region 104a in accordance with some embodiments. In addition, the dummy gate stacks 122c and 122d are formed across the fins 112a and 112b over the second-type well region 106a and across the fins 112c and 112d over the first-type well region 104a.

In some embodiments, the dummy gate stacks 122a through 122d individually include a gate dielectric layer 124 and a gate electrode layer 126 formed over the gate dielectric layer 124. In some embodiments, the gate dielectric layer 124 is made of silicon oxide. In some embodiments, the gate electrode layer 126 is made of polysilicon.

Figure 5:
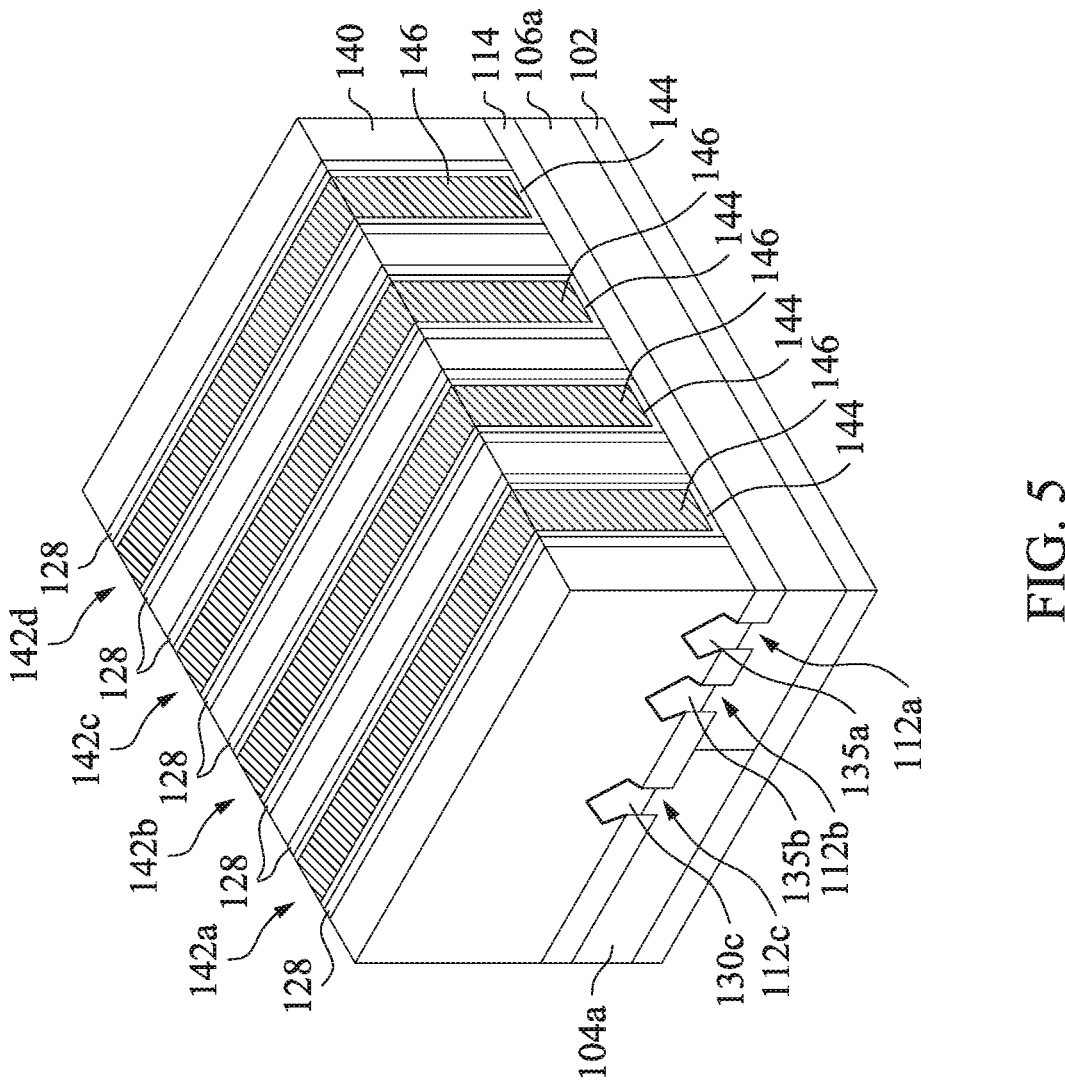

Referring to FIG. 5, after the dummy gate stacks 122a through 122d are formed, gate spacers 128 are formed on the sidewalls of the dummy gate stacks 122a through 122d. In some embodiments, the gate spacers 128 are made of silicon nitride, silicon oxide, silicon carbide, silicon oxynitride, or other applicable materials.

Next, source/drain structures are formed in the fins 112a through 112e adjacent to the dummy gate stacks 122a to 122d. More specifically, source/drain structures 135a are formed in the fin 112a at opposite sides of the dummy gate stacks 122a to 122d and source/drain structures 135b are formed in the fin 112b at opposite sides of the dummy gate stacks 122a to 122b over the second-type well region 106a. In addition, source/drain structures 130c are formed in the fins 112c and 112e at opposite sides of the dummy gate stacks 122a and 122d, and source/drain structures 130d (not shown in FIG. 5; shown in FIG. 3C) are formed in the fin 112d at opposite sides of the dummy gate stacks 122b and 122c over the first-type well region 104a.

The source/drain structures 135a, 135b, 130c, and 130d may be formed by recessing the fins 112a through 112e and growing semiconductor materials in the recesses by performing epitaxial processes. The semiconductor materials may include Si, SiP, SiC, SiPC, InP, GaAs, AlAs, InAs, InAlAs, InGaAs, SiGe, SiGeB, Ge, InSb, GaSb, InGaSb, or the like.

After the source/drain structures 135a, 135b, 130c, and 130d are formed, an inter-layer dielectric (ILD) layer 140 is formed around the dummy gate stacks 122a through 122d to cover the source/drain structures 135a, 135b, 130c, and 130d and the isolation structure 114. The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

Still referring to FIG. 5, after the ILD layer 140 is formed, the dummy gate stacks 122a through 122d are replaced by metal gate stacks 142a through 142d. In some embodiments, the metal gate stacks 142a through 142d individually include gate dielectric layers 144 and gate electrode layers 146. In some embodiments, the gate dielectric layers 144 are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO2-Al$_2$O$_3$) alloy, or other applicable dielectric materials. In some embodiments, the gate electrode layers 146 are made of a conductive material, such as aluminum, copper, tungsten, titanium, tantalum, or other applicable materials. The metal gate stacks 142a to 142d may further include work functional layers (not shown) between the gate dielectric layers 144 and the gate electrodes layers 146 so the metal gate stacks 142a to 142d may have the proper work function values.

Figure 6:
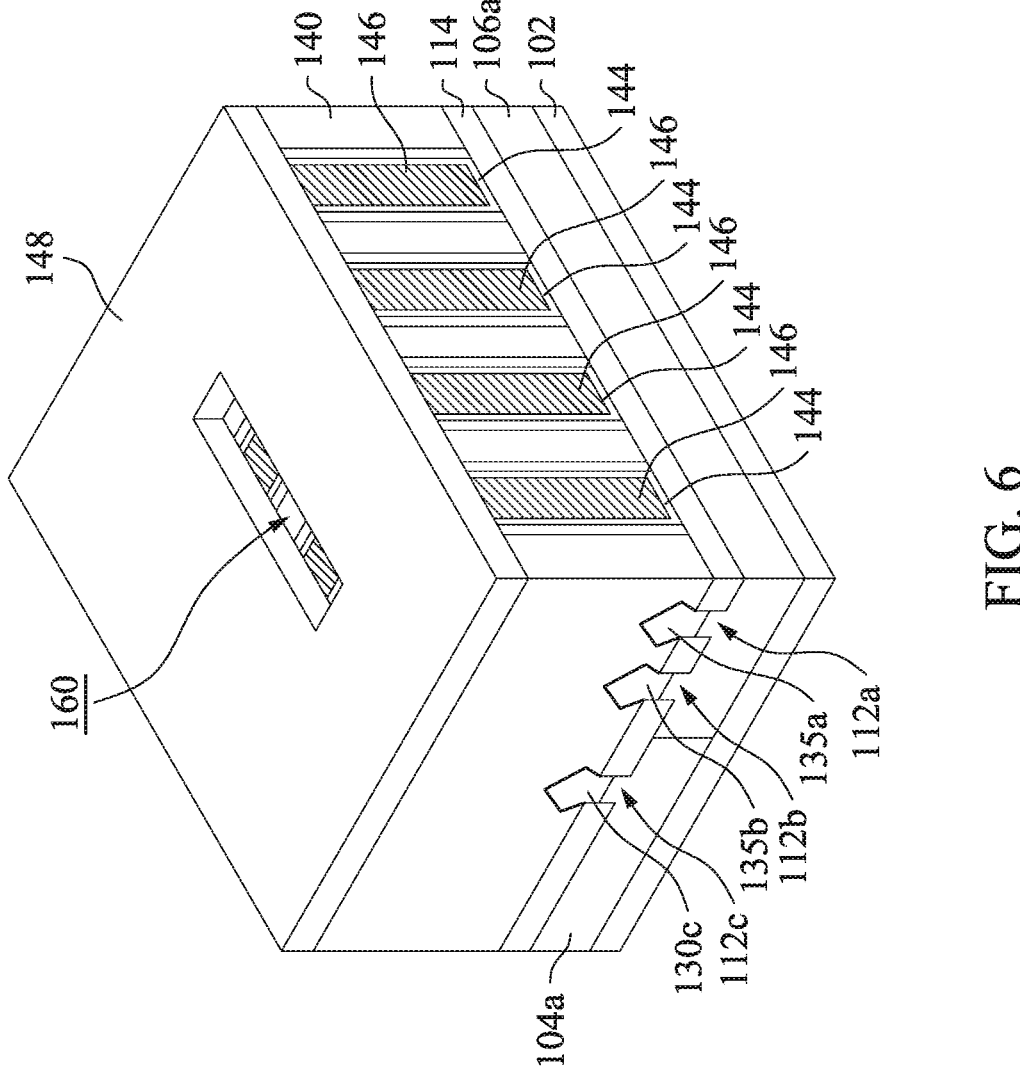

Referring to FIG. 6, a mask layer 148 is formed to cover the metal gate stacks 142a to 142d and the ILD layer 140. In addition, the mask layer 148 includes an opening 160 exposing the portions of the metal gate stacks 142b and 142c that are designed to be cut (e.g. removed) in subsequent etching process in accordance with some embodiments. The opening 160 exposes some portions of the metal gate stacks 142b and 142c and the gate spacers 128 and the portions of the ILD layer 140 between and adjacent to the exposed portions of the metal gate stacks 142b and 142c. In some embodiments, the mask layer 148 is made of silicon nitride, silicon oxynitride, silicon oxide, titanium nitride, silicon carbide, one or more other applicable materials, or a combination thereof. The mask layer 148 may be formed by depositing a dielectric layer using a spin-on process, a CVD process, a PVD process, or other applicable processes and patterning the dielectric layer through an opening in a photoresist layer (not shown) formed over the dielectric layer.

Figure 7:
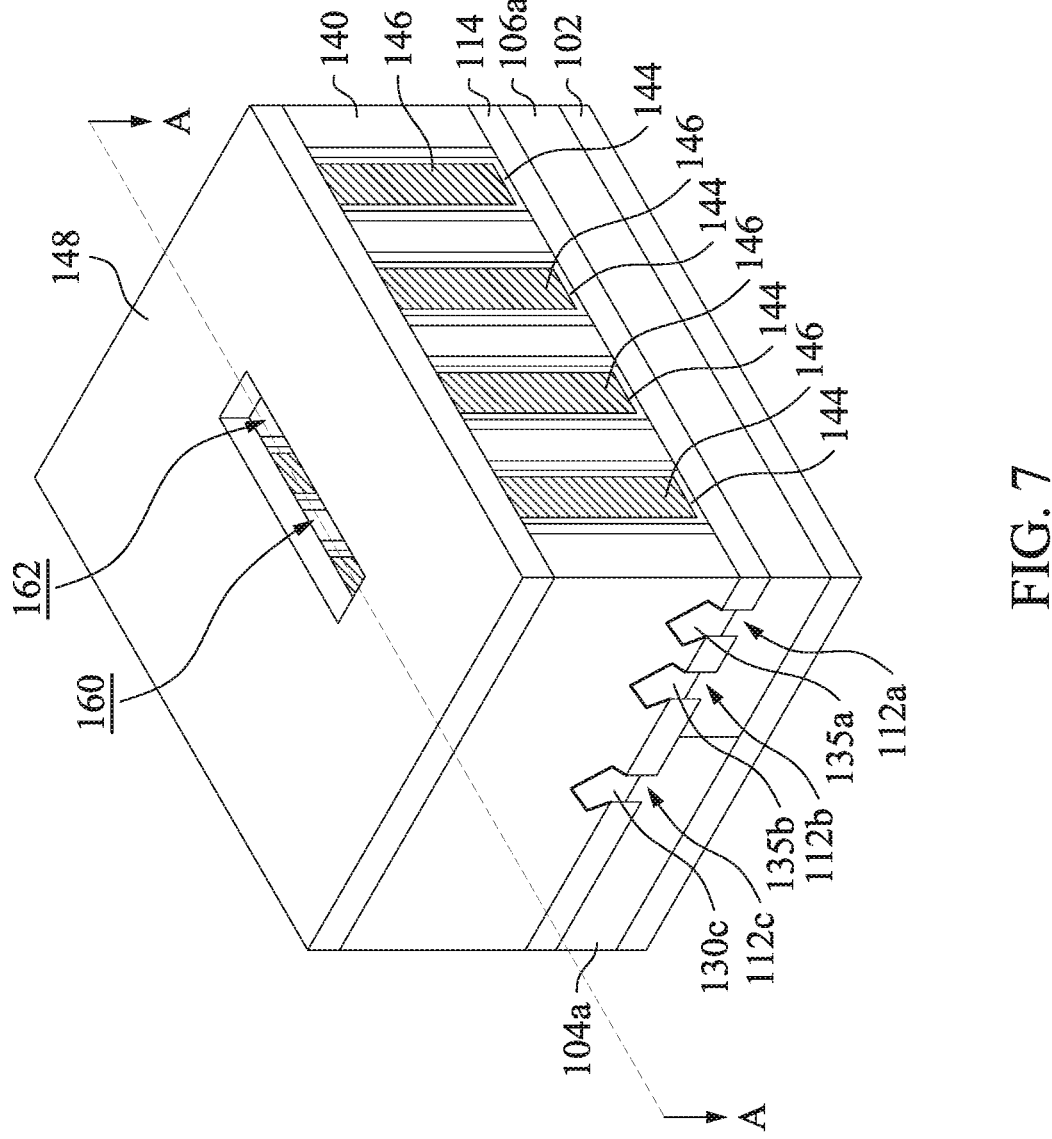
Figure 8B:
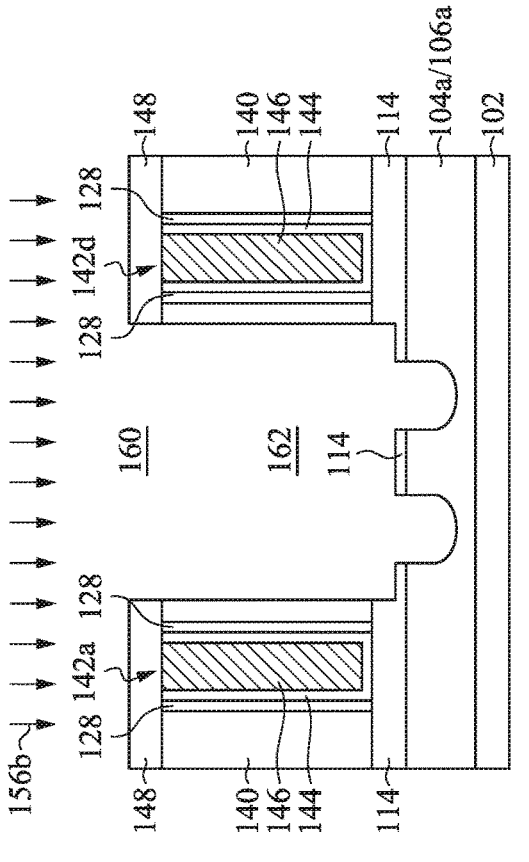
FIGS. 8A, 8B, and 8C illustrate cross-sectional views of a semiconductor structure during a fabrication process according to the method of FIG. 14, in accordance with some embodiments of the present disclosure.
Figure 8A:
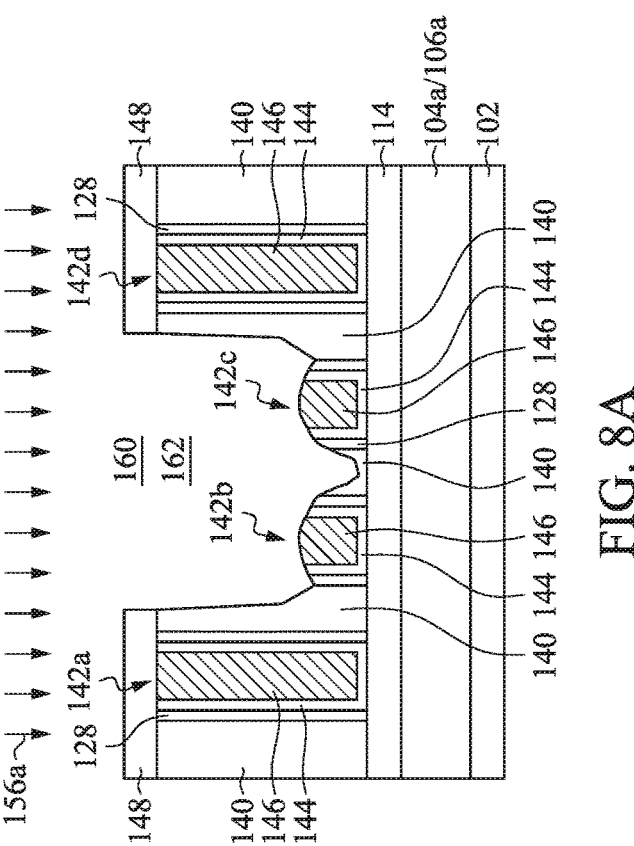
Figure 8C:
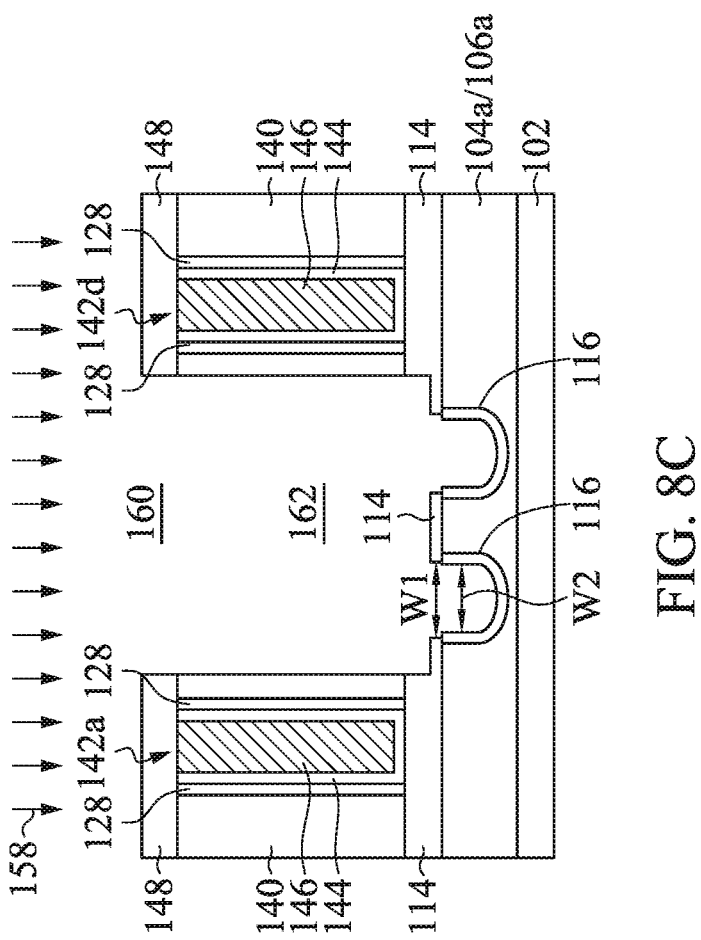

Referring to FIG. 7, after the mask layer 148 is formed, the exposed portions of the metal gate stacks 142b and 142c and the exposed portions of the ILD layer 140 are etched through the opening 160 of the mask layer 148 to form a recess 162. The recess 162 is also referred to as a CMG trench. In some embodiments, the portions of the metal gate stacks 142b and 142c, the gate spacers 128, and the ILD layer 140 exposed by the opening 160 of the mask layer 148 are etched in an etching process. The etching process to remove the exposed metal gate stacks 142b and 142c may include a two-step etching process, in which the first etching step is applied before the recess 162 reaches the isolation region 114 and the second etching step is applied for an over-etching into the isolation region 114 to ensure the redundant portions of the metal gate stacks 142b and 142c are removed.

FIG. 8A illustrates a cross-sectional view along section line A-A of the semiconductor structure shown in FIG. 7, which is during the first etching step 156a of the two-step etching process. The first etching step 156a may have a higher etch selectivity for the dielectric material of the ILD layer 140 and the isolation region 114 than the metallic material of the redundant portions of the metal gate stacks 142b and 142c. The first etching step 156a may stop at a shallow layer close to the top surface of the isolation region 114 or when the top surface of the isolation region 114 is barely exposed in the recess 162. FIG. 8B illustrates a cross-sectional view along section line A-A of the semiconductor structure shown in FIG. 7, which is at the conclusion of the second etching step 156b of the two-step etching process. The second etching step 156b may have a higher etch selectivity for the metallic material of the redundant portions of the metal gate stacks 142b and 142c than the dielectric material of the ILD layer 140 and the isolation region 114. By switching the relatively stronger first etching step to the relatively weaker second etching step, the two-step etching process controls the depth of the recess 162 without excessively extending into the underneath well regions, which helps mitigating substrate leakage current and improving latch-up performance.

In some embodiments, the first etching step 156a includes a cyclic process, where each cycle includes a dry etching process and a cleaning process. The dry etching in each cycle may be performed using process gases selected from, and not limited to, $Cl_2$, $BCl_3$, Ar, and combinations thereof. The cleaning process may be a plasma cleaning process, such as a plasma including nitrogen gas ($N_2$) and hydrogen gas ($H_2$). The nitrogen gas is used to break or bombard some bonds in the residues remaining on sidewalls and bottom of the recess 162. The hydrogen gas is used to reduce the residues by using the hydrogen gas as a reducing agent. The cycle of the dry etching process and the cleaning process may be repeated two to ten times depending on the depth of the recess 162 needed before reaching the isolation region 114.

In some embodiments, the second etching step 156b includes a single etch operation and a single cleaning process. That is, the second etching step 156b does not include a cyclic process. Without using a cyclic process, the second etching step 156b controls the depth of the recess 162 from excessively extending into the underneath well regions. The single etch operation may be a dry etching process. To further milden the second etching step 156b, the etching is performed using an appropriate etching gas, such that during the etching process, a polymer such as $C_xH_y$ may be formed (with X and Y being integers) on the sidewalls of the recess 162. The polymer protects the exposed sidewalls of the recess 162 from over-etching. After the dry etching operation, the polymer may then be removed, for example, using oxygen ($O_2$).

Since the first etching step 156a is a cyclic process and the second etching step 156b includes a single etch operation, the two-step etching process may be termed as an "N+1" etching process. The numeral "N" represents the times the cyclic process is repeated, such as from two to ten. The numeral "1" represents the single etch operation following the cyclic process. In some embodiments, the second etching step 156b generates a polymer as a byproduct on sidewalls of the recess 162, while the first etching step 156a is substantially free from generating a polymer byproduct. In some embodiments, the etching operation during the second etching step 156b is generally weaker than the etching operation during the first etching step 156a.

Still referring to FIG. 8B, although the sidewalls of the recess 162 is depicted as substantially straight, the sidewalls of the resulting recess 162 may not be straight due to the differences of the etching rate of different materials and may appear tapered. The portions of the isolation structure 114 and the upper portions of the first-type well region 104a and the second-type well region 106a under the opening 160 are also etched, so that the recess 162 further extends through the isolation structure 114 and extends into the first-type well region 104a and the second-type well region 106a, as depicted. Alternatively, the "N+1" etching process may control the recess 162 from extending through the isolation structure 114 and from exposing the first-type well region 104a and the second-type well region 106a.

In some embodiments, the recess 162 is formed over the interface of the first-type well region 104a and the second-type well region 106a, and the interface of the first-type well region 104a and the second-type well region 106a is exposed by the recess 162. Furthermore, since the etching process for forming the recess 162 overall has a greater etching rate toward the metal gate stacks 142b and 142c than that toward the ILD layer 140 and the isolation region 114, the bottoms of the recess 162 originally under the metal gate stacks 142b and 142c are lower than the bottoms of the recess 162 originally under the gate spacers 128 and the ILD layer 140, such that a bottom portion of the isolation region 114 is partially remained in the recess 162. However, although the portions of the recess 162 originally under the metal gate stacks 142b and 142c are relatively deeper, the recess 162 does not penetrate the first-type well region 104a and the second-type well region 106a. That is, the bottom-most of the recess 162 is higher than the bottom surfaces of the first-type well region 104a and the second-type well region 106a in accordance with some embodiments.

Referring to FIG. 8C, after the recess 162 is formed, a dielectric layer 116 is selectively formed on exposed surfaces of the first-type well region 104a and the second-type well region 106a through a passivation process 158. The dielectric layer 116 creates a buffer zone at the interface between the positive charges from the to-be-formed gate-cut structure 172a and the semiconductor material of the first-type well region 104a and the second-type well region 106a. The buffer zone reduces the attraction force towards the carrier charges in the well regions and suppresses the substrate leakage current. In some embodiments, the dielectric layer 116 is an oxide layer, such as silicon dioxide, formed by oxidizing surfaces of the semiconductor substrate in the recess 162, such that a surface layer of the exposed first-type well region 104a and the second-type well region 106a is turned into an oxide layer. The passivation process 158 is thus an oxidation process. In some embodiments, the passivation process 158 may be an $O_2$ plasma process, thermal oxidation process, in-situ steam generation oxidation process (ISSG), or other oxidation process. In an embodiment, an $O_2$ plasma treatment is performed at a temperature of ambient to 300° C. In an embodiment, a low temperature anneal under high pressure is performed using a temperature of 500-800° C. The $O_2/N_2$ may be tuned from pure $O_2$ to $O_2/N_2$ partial pressure ratio of approximately 1%. The formation of the dielectric layer 116 may reduce the opening of the bottom portions of the recess 162 under the isolation region 114 from an opening width W1 to a reduced opening width W2, i.e., W2<W1, as depicted in FIG. 8C.

In some embodiments, the plasma treatment includes applying dopants into the dielectric layer 116. In some embodiments, the dopants may include fluorine, boron, nitrogen, phosphor, or the like. The dopant implantation process may be configured to modify the properties of the dielectric layer 116, so that the junction profile in the substrate 102 may be adjusted accordingly. The dopant implantation process also creates a thin layer of depletion region under the dielectric layer 116. In some embodiments. The dopant implantation process neutralizes the negative carrier charges in proximity to the to-be-formed gate-cut structure 172a. That is, a depletion region is created at the interface between the dielectric layer 116 and the semiconductor material of the well regions. The depletion region further limits the movement of the negative carrier charges in the well regions in proximity to the to-be-formed gate-cut structure 172a. In one embodiment, the dopant is boron, and the boron concentration decreases when it is further away from the dielectric layer 116.

Figure 9:
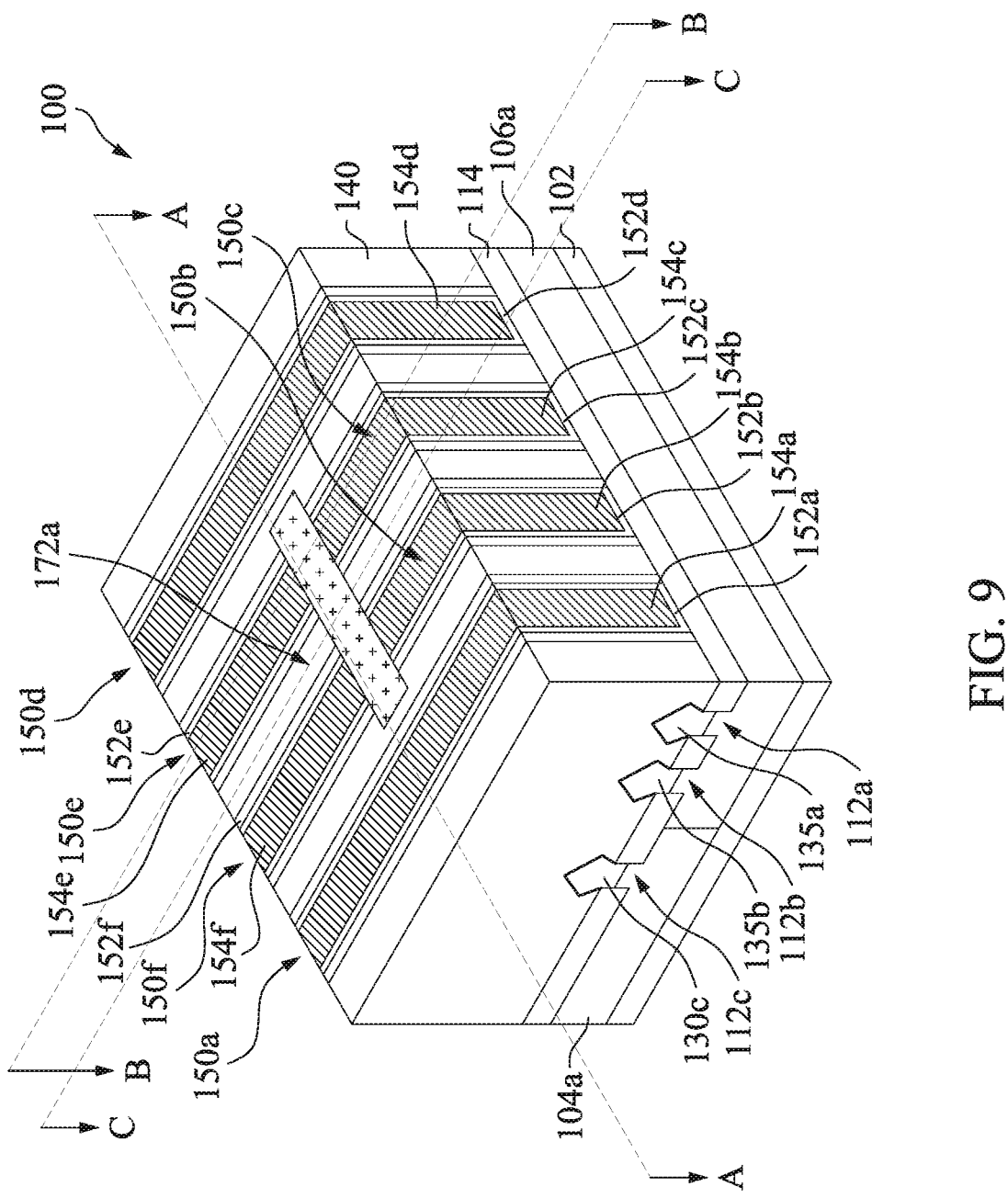
Figure 10A:
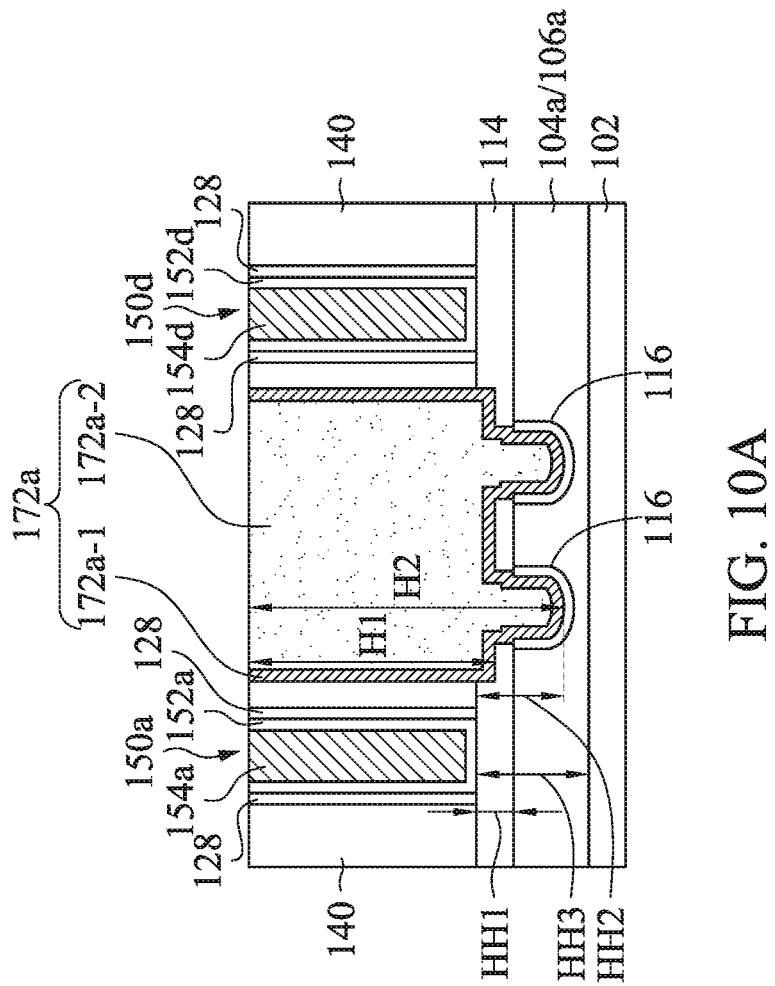
FIGS. 10A, 10B, and 10C illustrate cross-sectional views of the semiconductor structure of FIG. 1 in an alternative embodiment, in accordance with some embodiments of the disclosure.
Figure 10C:
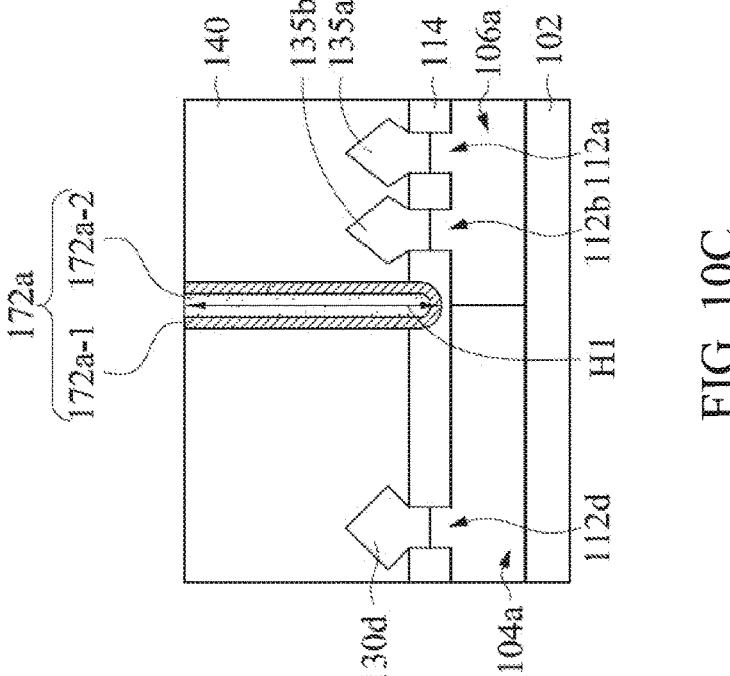
Figure 10B:
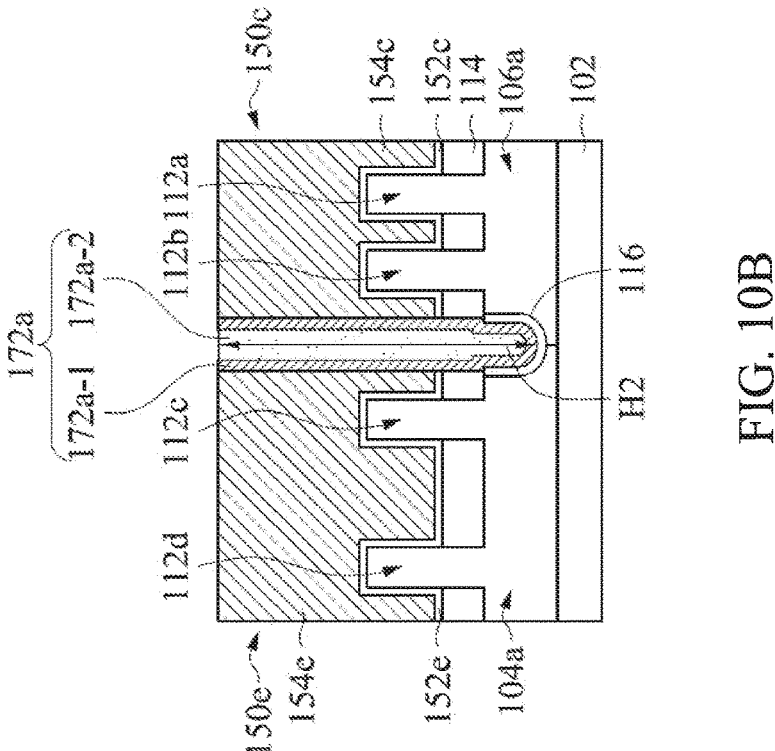

Afterwards, a gate-cut structure 172a is formed in the recess 162, and the mask layer 148 is removed to form a semiconductor structure 100, as shown in FIG. 9 in accordance with some embodiments. FIGS. 3A-3C discussed above are also cross-sectional views of the semiconductor structure 100 along section lines A-A, B-B, C-C of FIG. 9, respectively. In some embodiments, the gate-cut structure 172a is formed by depositing a dielectric material to fill in the recess 162, and polishing the dielectric material until the top surface of the ILD layer 140 is exposed. In some embodiments, the gate-cut structure 172a (as well as the gate-cut structure 172b) is made of a nitrogen-containing material, such as SiN, SiOCN, and SiON. In some alternative embodiments, the gate-cut structure 172a (as well as the gate-cut structure 172b) is a multi-layer structure, such as shown in FIGS. 10A-10C. The alternative embodiment as shown in FIGS. 10A-10C is similar to the embodiment as shown in FIGS. 3A-3C. One difference is that the gate-cut structure 172a in FIGS. 10A-10C includes a blanket deposited first dielectric layer 172a-1 (e.g., a SiN layer having a uniform thickness) as a liner layer and a second dielectric layer 172a-2 (e.g., a $SiO_2$ layer) over the first layer 172a-1 as a main dielectric layer. Further, the gate-cut structure 172a as depicted below in FIGS. 11A-13C in accordance with various other embodiments of the present disclosure may similarly be a single layer or multi-layer structure.

As previously shown in FIG. 1, the gate-cut structures (e.g. the gate-cut structures 172a and 172b) may be formed to separate the metal gate stacks 142a through 142d into various gate structures, although FIGS. 3A-9 only show the gate-cut structure 172a. More specifically, the metal gate stack 142b is cut to form gate structures 150b and 150f separating by the gate-cut structure 172a, and the metal gate stack 142c is cut to form gate structures 150c and 150e by the gate-cut structure 172a. In addition, the metal gate stacks 142a and 142d are also cut (not shown in FIG. 3A-9; shown in FIG. 1) to form the gate structures 150a and 150d in accordance with some embodiments. In some embodiments, the gate structures 150a, 150b, 150c, 150d, 150c, and 150f respectively includes gate dielectric layers 152a, 152b, 152c, 152d, 152e, and 152f (i.e. the gate dielectric layer 144) and gate electrode layers 154a, 154b, 154c, 154d, 154c, and 154f (i.e. the gate electrode layer 146).

Figure 11A:
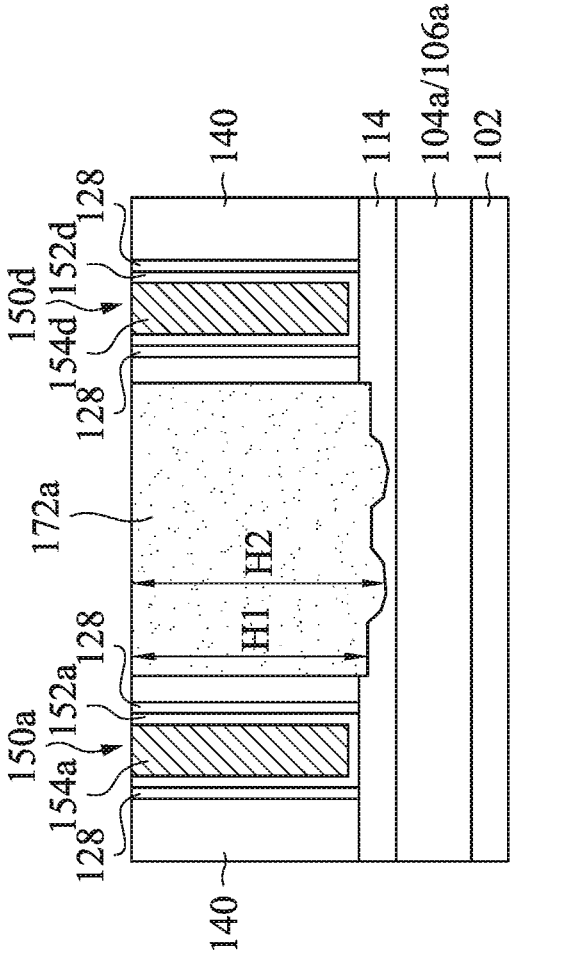
FIGS. 11A, 11B, and 11C illustrate cross-sectional views of the semiconductor structure of FIG. 1 in an alternative embodiment, in accordance with some embodiments of the disclosure.
Figure 11C:
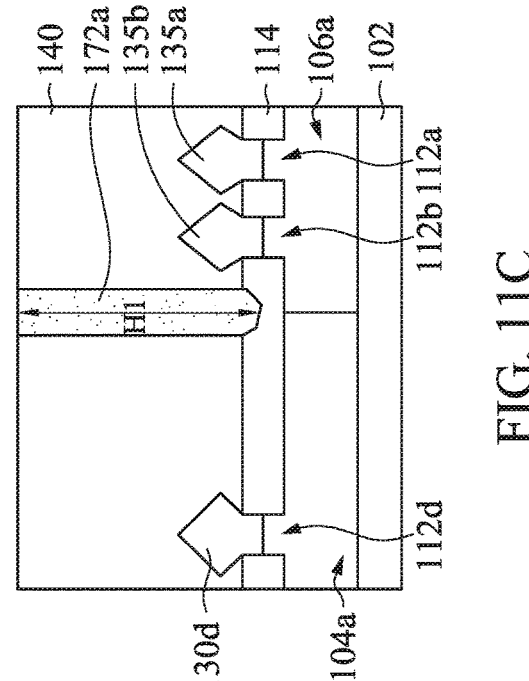
Figure 11B:
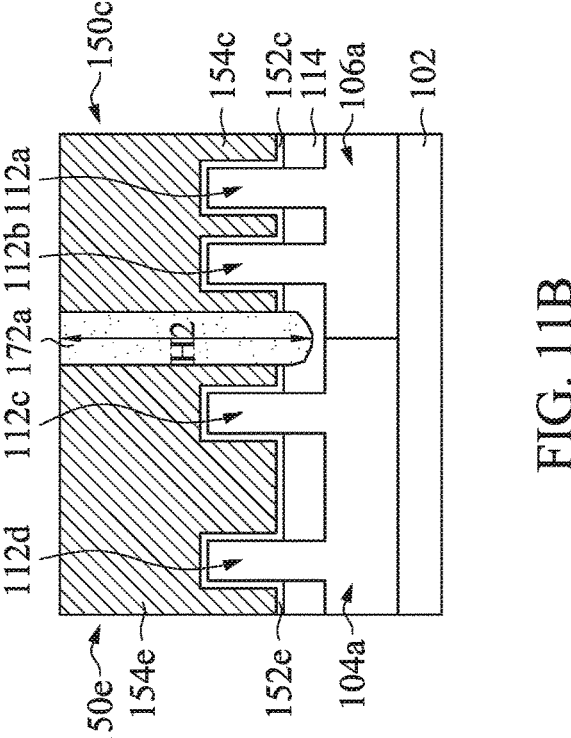

Referring to FIGS. 3A-3C and 9, the gate-cut structure 172a penetrates the isolation region 114 and extends into the first-type well region 104a and the second-type well region 106a at locations where the redundant portions of the metal gate stacks 142b and 142c are removed. Alternatively, FIGS. 11A-11C illustrate an alternative embodiment, in which the "N+1" etching process controls the depth of the recess 162 such that the gate-cut structure 172a does not penetrate the isolation region 114. Since the first-type well region 104a and the second-type well region 106a are not exposed, the formation of the dielectric layer 116 and the dopant implantation may be optionally skipped. The etching of the recess 162 may be controlled by a timer to control the depth of the recess 162.

Figure 12A:
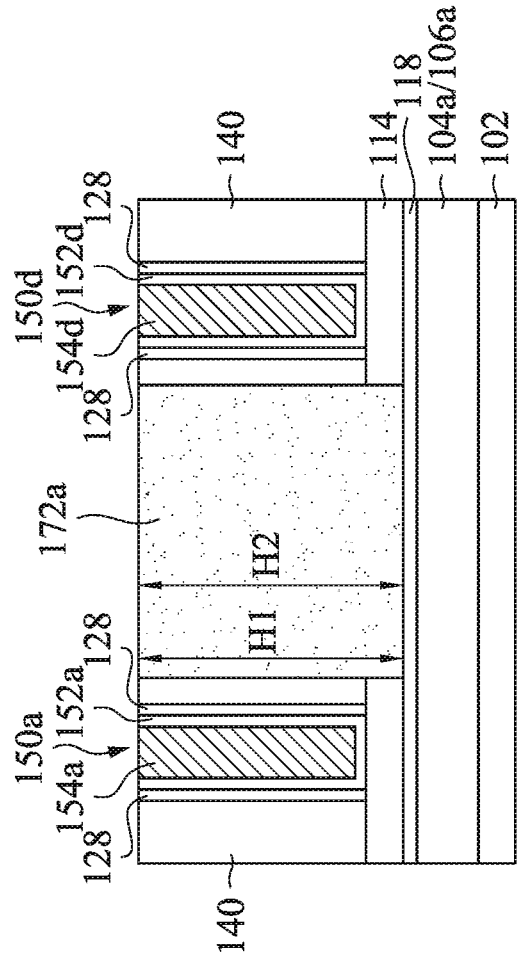
FIGS. 12A, 12B, and 12C illustrate cross-sectional views of the semiconductor structure of FIG. 1 in another alternative embodiment, in accordance with some embodiments of the disclosure.
Figure 12C:
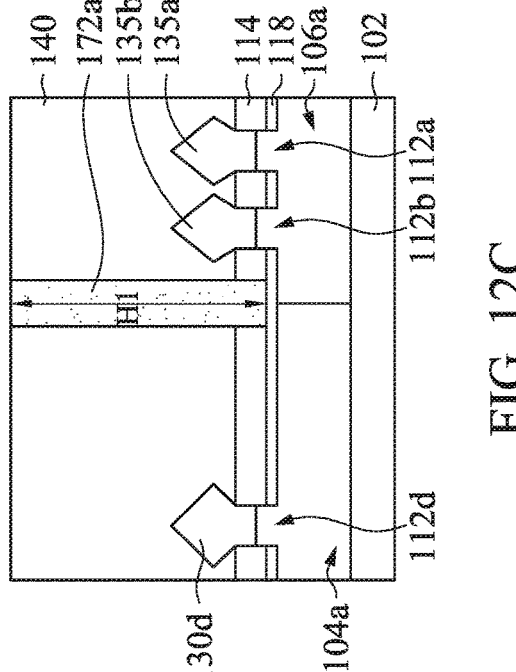
Figure 12B:
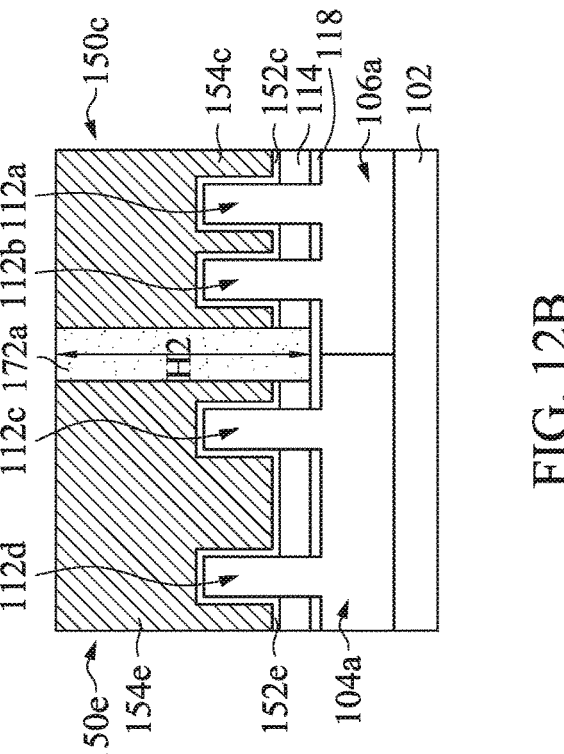

FIGS. 12A-12C illustrate another embodiment, in which an etch stop layer (ESL) 118 is formed under the isolation region 114 to prevent the recess 162 to extend into the first-type well region 104a and the second-type well region 106a. In some embodiments, after patterning the top portion of the substrate 102 to form the fins 112, the ESL 118 is formed by depositing a dielectric material in the trenches between the fins 112 and subsequently recessing the dielectric material to expose top portions of the fins 112. Afterwards, the isolation region 114 is formed over the ESL 118. In an embodiment, the ESL 118 may comprise SiN, SiCN, SiON, the like, or a combination thereof and may be formed by atomic layer deposition (ALD), molecular layer deposition (MLD), a furnace process, CVD, plasma-enhanced CVD (PECVD), plasma-enhanced silicon nitride (PESiN), the like, or a combination thereof. In an embodiment, the ESL 118 may be formed to have a thickness from about 3 nm to about 10 nm. The ESL 118 includes a material composition different from the isolation region 114. The etchant applied in the second etching step of the "N+1" etching process is selected such that the ESL 118 substantially remains intact after the etching of the isolation region 114. As shown in FIGS. 12A-12C, the ESL 118 allows an over-etching of the isolation region 114 and the resulting recess 162 has substantially the same thickness at different portions (i.e., H1=H2). Since the first-type well region 104a and the second-type well region 106a are not exposed, the formation of the dielectric layer 116 and the dopant implantation may be optionally skipped.

Figure 13A:
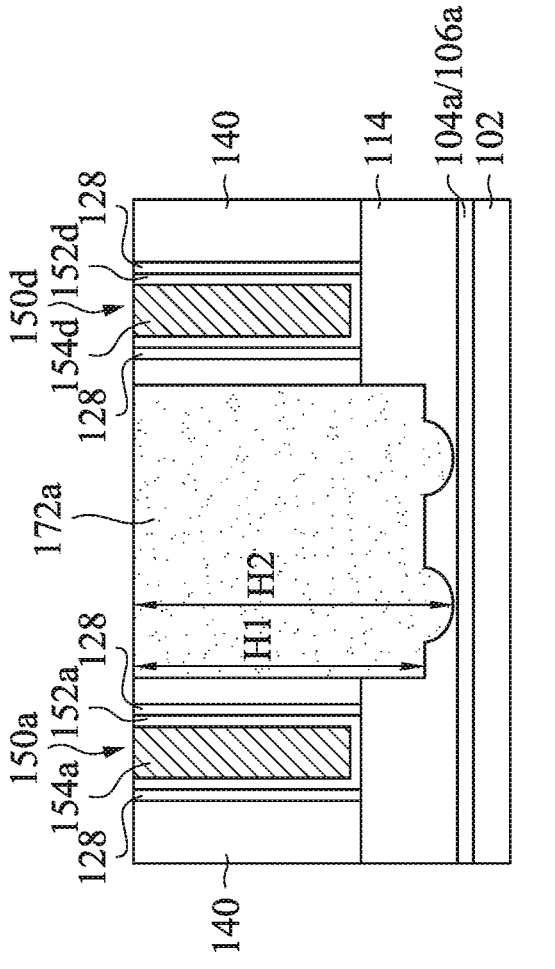
FIGS. 13A, 13B, and 13C illustrate cross-sectional views of the semiconductor structure of FIG. 1 in yet another alternative embodiment, in accordance with some embodiments of the disclosure.
Figure 13C:
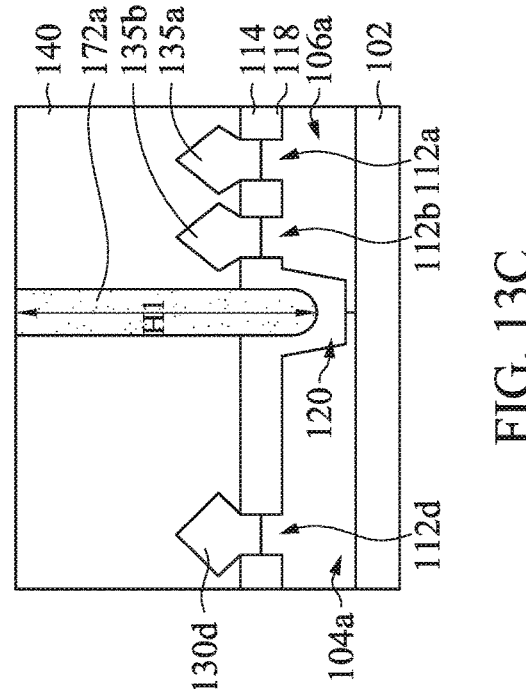
Figure 13B:
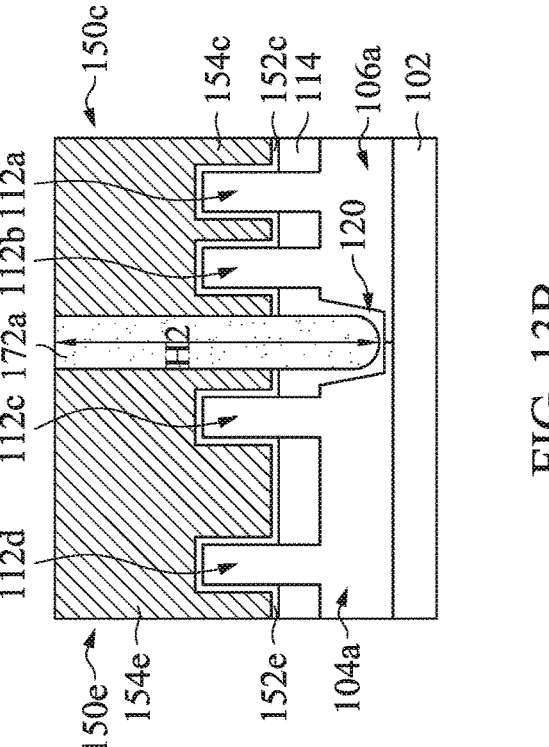

FIGS. 13A-13C illustrate yet another embodiment, in which a trench 120 is formed at the interface of the first-type well region 104a and the second-type well region 106a prior to the formation of the isolation region 114. In some embodiments, after patterning the top portion of the substrate 102 to form the fins 112, the trench 120 is formed by further patterning the substrate 102 at the interface of the first-type well region 104a and the second-type well region 106a in a separate lithography and etching process. Subsequently, the isolation region 114 is formed. The trench 120 allows the respective portion of the isolation region 114 to be thicker. Thus, even the two-step etching process may extend the recess 162 to be below the bottom surface of the isolation region 114 in regions outside of the trench 120, the recess 162 still does not penetrate the isolation region 114 at the location of the trench 120. Consequently, the gate-cut structure 172a has no physical contact with the underneath well regions. Since the first-type well region 104a and the second-type well region 106a are not exposed, the formation of the dielectric layer 116 and the dopant implantation may be optionally skipped. The etching of the recess 162 may be controlled by a timer to control the depth of the recess 162.

FIG. 14 is a flow diagram of an example method 200 for fabricating the semiconductor structure (or semiconductor device) 100 as illustrated in FIGS. 3A-13C, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein.

At operation 202, the method 200 patterns a top portion of the substrate 102 to form fins 112. The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. At operation 204, the method 200 may optionally further recess a top portion of the substrate 102 to form a trench 120 (FIGS. 13B and 13C) at the interface of an N-type well region and a P-type well region. At operation 206, an isolation region 114 is formed between the fins 112. Optionally, an ESL 118 (FIGS. 12A-12C) may be formed under the isolation region 114. At operation 208, dummy gate stacks 122 are formed across the fins 112. At operation 210, source/drain structures 130 and 135 are formed in the fins 112 in source/drain regions. At operation 212, the ILD layer 140 is formed between the dummy gate stacks 122. At operation 214, the dummy gate stacks 122 are replaced by the metal gate stacks 142. At operation 216, a two-step etching process is performed to remove redundant portions of the metal gate stacks to form a CMG trench 162. Depending on whether the trench 120 and/or the ESL 118 are optionally formed, the CMG trench 162 may or may not penetrate the isolation region 114 in various embodiments. At operation 218, if the N-type well region and/or the P-type well region are exposed in the CMG trench 162, a dielectric layer 116 is selectively formed on exposed surfaces of the respective well region. Optionally, a dopant implantation process may be performed to create a depletion region under the dielectric layer 116. At operation 220, dielectric material (s) is deposited in the CMG trench 162 to form the gate-cut structure 172.

Embodiments for a semiconductor structure are provided. PMOS transistors formed in an N-type well region and the NMOS transistors formed in a P-type well region are separated by an isolation region (e.g., STI). A dielectric structure is formed at a boundary (or a junction, interface) between the P-type and N-type well regions as a gate-cut structure. The various exemplary configurations of the gate-cut structure in the present disclosure tend to suppress the substrate leakage current between the P-type well region and the N-type well region and in turn improve latch-up performance of the semiconductor structure.

In one exemplary aspect, the present disclosure is directed to a method for manufacturing a semiconductor device. The method includes forming a fin over a semiconductor substrate, forming an isolation region on sidewalls of the fin, forming a metal gate over the fin and the isolation region, etching the metal gate to form a trench through the isolation region, the trench exposing a top portion of the semiconductor substrate, passivating the top portion of the semiconductor substrate to form a dielectric layer at a bottom of the trench, and depositing a dielectric material in the trench to form a dielectric structure, the dielectric structure dividing the metal gate into two sections. In some embodiments, the passivating of the top portion of the semiconductor substrate is an oxidization process, and the dielectric layer is an oxide layer. In some embodiments, the oxidization process is an $O_2$ plasma process. In some embodiments, the trench is directly above an interface between an N-type well region and a P-type well region of the semiconductor substrate. In some embodiments, the method also includes after the etching of the metal gate to form the trench, implanting a dopant into the top portion of the semiconductor substrate through the trench. In some embodiments, the dopant is boron. In some embodiments, the implanting of the dopant creates a depletion region under the dielectric layer. In some embodiments, the etching of the metal gate includes a first etching step and a second etching step that differs from the first etching step. In some embodiments, the first etching step includes a cyclic etching operation, and the second etching step includes a single etching operation. In some embodiments, the second etching step produces a polymer byproduct, and the first etching step is free of producing the polymer byproduct.

In another exemplary aspect, the present disclosure is directed to a method for manufacturing a semiconductor device. The method includes patterning a top portion of a substrate to form a first fin and a second fin, recessing a region of the substrate between the first fin and the second fin to form a trench, the trench exposing an interface between a first-type well region and a second-type well region of the substrate, the first-type well region and the second-type well region being of opposite conductivity types, depositing an isolation layer between the first fin and the second fin and filling the trench, forming a metal gate over the first fin and the second fin, etching the metal gate to form a recess through the metal gate and extending into the trench, and depositing a dielectric material in the recess to form a dielectric structure that divides the metal gate into a first section over the first fin and a second section over the second fin. In some embodiments, a bottommost portion of the dielectric structure is separated from the first-type well region and the second-type well region by a portion of the isolation layer in the trench. In some embodiments, the method also includes forming a first epitaxial structure on the first fin and a second epitaxial structure on the second fin. A first portion of the dielectric structure laterally between the first section and the second section of the metal gate has a first height, a second portion of the dielectric structure laterally between the first epitaxial structure and the second epitaxial structure has a second height, and the first height is larger than the second height. In some embodiments, the etching of the metal gate includes a first etching step and a second etching step that is weaker than the first etching step. In some embodiments, the first etching step includes a cyclic etching operation, and the second etching step includes a single etching operation. In some embodiments, the first section of the metal gate and the first fin forms a pass-gate transistor of a memory cell, and the second section of the metal gate and the second fin forms a pull-up transistor of the memory cell.

In yet another exemplary aspect, the present disclosure is directed to a semiconductor device. The semiconductor device includes a first gate electrode across a first fin over a first-type well region of a semiconductor substrate, a second gate electrode across a second fin over a second-type well region of the semiconductor substrate, the first-type well region and the second-type well region having opposite conductivity types, an isolation layer disposed over the semiconductor substrate and on sidewalls of the first fin and the second fin, a gate-cut structure separating the first gate electrode from the second gate electrode, the gate-cut structure extending through the isolation layer, and a dielectric layer disposed on the gate-cut structure and separating the gate-cut structure from the semiconductor substrate, the dielectric layer being below a bottom surface of the isolation layer. In some embodiments, the semiconductor device also includes a depletion region stacked between the dielectric layer and the semiconductor substrate. In some embodiments, the dielectric layer and the depletion region are implanted with boron. In some embodiments, the gate-cut structure has a first portion directly above the isolation layer and a second portion directly above an interface between the first-type well region and the second-type well region, the first portion has a first height and the second portion has a second height that is larger than the first height.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming a fin over a semiconductor substrate;

forming an isolation region on sidewalls of the fin;

forming a metal gate over the fin and the isolation region;

etching the metal gate to form a trench through the isolation region, wherein the trench exposes a top portion of the semiconductor substrate;

passivating the top portion of the semiconductor substrate to form a dielectric layer at a bottom of the trench; and depositing a dielectric material in the trench to form a dielectric structure, wherein the dielectric structure divides the metal gate into two sections.

2. The method of claim 1, wherein the passivating of the top portion of the semiconductor substrate is an oxidization process, and the dielectric layer is an oxide layer.

3. The method of claim 2, wherein the oxidization process is an $O_2$ plasma process.

4. The method of claim 1, wherein the trench is directly above an interface between an N-type well region and a P-type well region of the semiconductor substrate.

5. The method of claim 1, further comprising:

after the etching of the metal gate to form the trench, implanting a dopant into the top portion of the semiconductor substrate through the trench.

6. The method of claim 5, wherein the dopant is boron.

7. The method of claim 5, wherein the implanting of the dopant creates a depletion region under the dielectric layer.

8. The method of claim 1, wherein the etching of the metal gate includes a first etching step and a second etching step that differs from the first etching step.

9. The method of claim 8, wherein the first etching step includes a cyclic etching operation, and the second etching step includes a single etching operation.

10. The method of claim 8, wherein the second etching step produces a polymer byproduct, and the first etching step is free of producing the polymer byproduct.

11. A method of forming a semiconductor structure, comprising:

patterning a top portion of a substrate to form a first fin and a second fin;

after the patterning of the top portion of the substrate to form the first fin and the second fin, recessing a region of the substrate between the first fin and the second fin to form a trench, wherein the trench exposes an interface between a first-type well region and a second-type well region of the substrate, wherein the first-type well region and the second-type well region are of opposite conductivity types;

depositing an isolation layer between the first fin and the second fin and filling the trench;

forming a metal gate over the first fin and the second fin;

etching the metal gate to form a recess through the metal gate and extending into the trench; and depositing a dielectric material in the recess to form a dielectric structure that divides the metal gate into a first section over the first fin and a second section over the second fin.

12. The method of claim 11, wherein a bottommost portion of the dielectric structure is separated from the first-type well region and the second-type well region by a portion of the isolation layer in the trench.

13. The method of claim 11, further comprising:

forming a first epitaxial structure on the first fin and a second epitaxial structure on the second fin, wherein a first portion of the dielectric structure laterally between the first section and the second section of the metal gate has a first height, a second portion of the dielectric structure laterally between the first epitaxial structure and the second epitaxial structure has a second height, and the first height is larger than the second height.

14. The method of claim 11, wherein the etching of the metal gate includes a first etching step and a second etching step that is weaker than the first etching step.

15. The method of claim 14, wherein the first etching step includes a cyclic etching operation, and the second etching step includes a single etching operation.

16. The method of claim 11, wherein the first section of the metal gate and the first fin forms a pass-gate transistor of a memory cell, and the second section of the metal gate and the second fin forms a pull-up transistor of the memory cell.

17. A semiconductor device, comprising:

a first gate electrode across a first fin over a first-type well region of a semiconductor substrate;

a second gate electrode across a second fin over a second-type well region of the semiconductor substrate, wherein the first-type well region and the second-type well region have opposite conductivity types;

an isolation layer disposed over the semiconductor substrate and on sidewalls of the first fin and the second fin;

a gate-cut structure separating the first gate electrode from the second gate electrode, wherein the gate-cut structure extends through the isolation layer; and a dielectric layer disposed on the gate-cut structure and separating the gate-cut structure from the semiconductor substrate, wherein the dielectric layer is below a bottom surface of the isolation layer.

18. The semiconductor device of claim 17, further comprising:

a depletion region stacked between the dielectric layer and the semiconductor substrate.

19. The semiconductor device of claim 18, wherein the dielectric layer and the depletion region are implanted with boron.

20. The semiconductor device of claim 17, wherein the gate-cut structure has a first portion directly above the isolation layer and a second portion directly above an interface between the first-type well region and the second-type well region, the first portion has a first height and the second portion has a second height that is larger than the first height.

\* \* \* \* \*